United States Patent
Shirakawa et al.

(10) Patent No.: US 6,773,862 B2
(45) Date of Patent: Aug. 10, 2004

(54) NEGATIVE RESIST COMPOSITION

(75) Inventors: Koji Shirakawa, Haibara-gun (JP);
Yutaka Adegawa, Haibara-gun (JP);
Shoichiro Yasunami, Haibara-gun (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 96 days.

(21) Appl. No.: 10/274,386

(22) Filed: Oct. 21, 2002

(65) Prior Publication Data
US 2003/0124456 A1 Jul. 3, 2003

(30) Foreign Application Priority Data
Oct. 19, 2001 (JP) ................................. P. 2001-322176

(51) Int. Cl.⁷ ............................ G03C 1/73; G03F 7/038
(52) U.S. Cl. ................. 430/270.1; 430/287.1; 430/325; 430/905; 430/906; 430/907; 430/914; 430/296; 430/942; 430/966; 430/967
(58) Field of Search .................... 430/270.1, 287.1, 430/325, 905, 906, 907, 914, 296, 942, 966, 967

(56) References Cited

U.S. PATENT DOCUMENTS 6,673,512 B1 * 1/2004 Uenishi et al. .......... 430/270.1

FOREIGN PATENT DOCUMENTS

| JP | 5-181277 | 7/1993 |
| JP | 5-289340 | 11/1993 |
| JP | 6-83055 | 3/1994 |
| JP | 7-128855 | 5/1995 |
| JP | 7-146556 | 6/1995 |
| JP | 8-110638 | 4/1996 |
| JP | 9-43837 | 2/1997 |
| JP | 11-125907 | 5/1999 |

* cited by examiner

Primary Examiner—Mark F. Huff
Assistant Examiner—Sin J. Lee
(74) Attorney, Agent, or Firm—Sughrue Mion, PLLC

(57) ABSTRACT

A negative resist composition comprising: (A) a compound being capable of generating an acid upon irradiation with an actinic ray or a radiation; (B) an alkali-soluble polymer; and (C) at least two crosslinking agents being capable of generating crosslinking with the polymer (B) by an action of an acid, wherein the crosslinking agent (C) comprises at least two compounds having a different skeleton from each other, which are selected from phenol derivatives having at least one of a hydroxymethyl group and an alkoxymethyl group on a benzene ring thereof, in which a sum of the hydroxymethyl group and the alkoxymethyl group is two or more, one of the at least two crosslinking agents comprises one or two benzene rings in the molecule thereof, and other one of the at least two crosslinking agents comprises from 3 to 5 benzene rings in the molecule thereof.

16 Claims, No Drawings

NEGATIVE RESIST COMPOSITION

FIELD OF THE INVENTION

The present invention relates to a negative resist composition which is used in the production steps of lithographic printing plates and semiconductors such as IC, in the production of circuit boards of liquid crystals, thermal heads, etc., and in other fabrication steps. In particular, the negative resist composition of the invention acts by far ultraviolet rays (including excimer laser), electron beams, X-rays, or high-energy radiations such as emitted light.

BACKGROUND OF THE INVENTION

In the production process of semiconductor devices such as IC and LSI, there has hitherto been employed microfabrication by lithography using a photoresist composition. In recent years, with the high integration of integrated circuits, it is being demanded to form hyperfine patterns of a sub-micron region or a quarter-micron region. Following this, there is seen a tendency that the exposure wavelength becomes shorter, for example, from g-rays to i-rays and further to a KrF excimer laser light. In addition, besides the excimer laser light, development of lithography using electron beams proceeds at present. As resists suited for the excimer laser or electron beams-lithography process are mainly employed chemically amplified resists.

A chemically amplified resist composition is a material in which upon irradiation with radiations such as far ultraviolet rays and electron beams, it generates an acid in an exposed area, and reaction using this acid as a catalyst changes the solubility to a development liquid in an irradiated area with the radiations and in a non-irradiated area, thereby forming a pattern on a substrate. The chemically amplified resist has high sensitivity and resolution and has an advantage such that an image can be formed with a compound capable of generating an acid upon irradiation at a small dose of radiations (this compound will be hereinafter referred to as "photo-acid generator").

Though the chemically amplified resist has advantages of high sensitivity and high resolution as described above, with the progress of finer patterns, line edge roughness of the pattern has become a serious problem that is never negligible.

The line edge roughness as referred to herein means a phenomenon in which a pattern of a resist and an edge at an interface with a substrate irregularly fluctuate in a vertical direction to the line direction due to characteristics of the resist, whereby when seeing from the upper side, the edge appears uneven. This unevenness is transferred by the etching step using the resist as a mask, thereby degrading the electrical properties, leading to a reduction of the yield. Especially, in hyperfine regions of 0.25 µm or less, the line edge roughness is an extremely important problem to be improved. The high sensitivity and high resolution and the good line edge roughness are in a trade-off relation, and therefore, it is very important how to make the both cope with each other.

With respect to the chemically amplified resists, there have been made various investigations from the viewpoints of acid generators, crosslinking agents, and so on. For example, JP-A-7-128855 (The term "JP-A" as used herein means an "unexamined published Japanese patent application") discloses triazine-based photo-acid generators; JP-A-9-43837 and JP-A-11-125907 disclose carboxylic acid-generating photo-acid generators; JP-A-5-181277 and JP-A-7-146556 disclose methoxymethylmelamine crosslinking agents; and JP-A-6-83055 discloses alkoxymethyl ether-type crosslinking agents. Further, as to additives, JP-A-5-289340 discloses amino acid-type additives; and JP-A-8-110638 discloses ammonium salt-type additives.

However, in any combinations of these compounds, high sensitivity, high resolution, good pattern shape, and good line edge roughness could not be satisfied simultaneously in hyperfine regions.

SUMMARY OF THE INVENTION

Accordingly, an object of the invention is to solve the problems in performance in micro-fabrication of semiconductor elements using actinic rays or radiations, especially KrF excimer laser, electron beams or X-rays and to provide a negative chemically amplified resist that can be satisfied simultaneously with the characteristics of sensitivity, resolution, pattern shape and line edge roughness in using KrF excimer laser, electron beams or X-rays.

The present inventors made extensive and intensive investigations. As a result, it has been found that the above-described-object can be achieved by adding at least two kinds of specific crosslinking agents in a chemically amplified negative resist composition using an alkali-soluble polymer, a crosslinking agent, and a photo-acid generator, leading to accomplishment of the invention.

The invention is constituted as follows.

(1) A negative resist composition comprising:
 (A) a compound which generates an acid upon irradiation with actinic rays or radiations,
 (B) an alkali-soluble polymer, and
 (C) a crosslinking agent which generates crosslinking with the polymer (B) by the action of an acid, wherein the crosslinking agent (C) contains at least two kinds of compounds having a different skeleton from each other, which are selected from phenol derivatives having two or more hydroxymethyl groups and/or alkoxymethyl groups on a benzene ring thereof, in which one kind of the crosslinking agent contains one or two benzene rings in the molecule thereof, and another kind of the crosslinking agent contains from 3 to 5 benzene rings in the molecule thereof.

(2) The negative resist composition as set forth in (1) above, further comprising (E) a nitrogen-containing basic compound.

(3) The negative resist composition as set forth in (1) or (2) above, wherein the polymer (B) is a polymer containing a recurring (repeating) unit represented by the following formula (b):

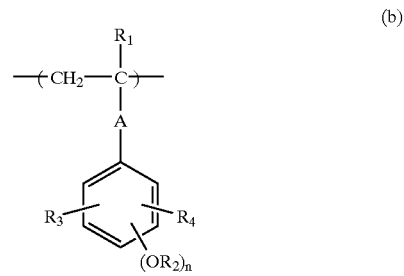

In the formula (b), $R_1$ represents a hydrogen atom, a halogen atom, a cyano group, or an optionally substituted alkyl group; $R_2$ represents a hydrogen atom or an optionally substituted alkyl group, cycloalkyl group, aryl group, aralkyl group or acyl group; $R_3$ and $R_4$, which may be the same or different, each represents a hydrogen atom, a halogen atom, a cyano group, or an optionally substituted alkyl group, cycloalkyl group, alkenyl group, aralkyl group or aryl group; A represents a simple bond (single bond), an optionally substituted alkylene group, alkenylene group, cycloalkylene group or arylene group, or —O—, —SO$_2$—, —O—CO—R$_5$—, —CO—O—R$_6$— or —CO—N(R$_7$)—R$_8$—; $R_5$, $R_6$, and $R_8$, which may be the same or different, each represents a simple bond, an optionally substituted alkylene group, alkenylene group, cycloalkylene group or arylene group singly, or a divalent group formed from at least one of these groups taken together with at least one member selected from the group consisting of an ether structure, an ester structure, an amide structure, a urethane structure, and a ureido structure; $R_7$ represents a hydrogen atom or an optionally substituted alkyl group, cycloalkyl group, aralkyl group or aryl group; n represents an integer of from 1 to 3; and plural $R_2$'s, or $R_2$ and $R_3$ or $R_4$, may be bound to each other to form a ring.

(4) The negative resist composition as set forth in (1) or (2) above, wherein the polymer (B) is a polymer containing at least one recurring unit represented by the following formula (b-2) or (b-3):

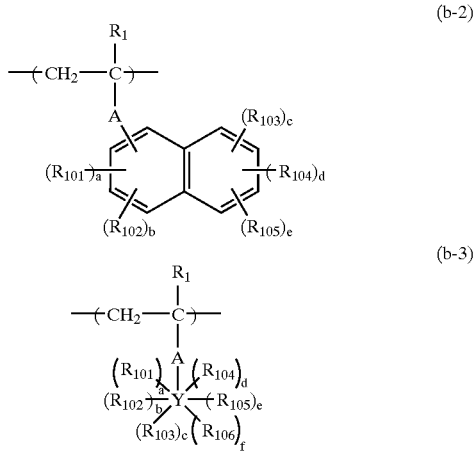

In the formulae (b-2) and (b-3), $R_1$ and A are synonymous with $R_1$ and A in the formula (b); $R_{101}$ to $R_{106}$ each independently represents a hydroxyl group, a carboxy group, an amino group, or an optionally substituted alkyl group, cycloalkyl group, alkoxy group, alkylcarbonyloxy group, alkylsulfonyloxy group, alkenyl group, aryl group, aralkyl group, N-alkylamino group or N-dialkylamino group; a to f each independently represents an integer of from 0 to 3; and Y represents any one of the following fused (condensed) polycyclic aromatic structures:

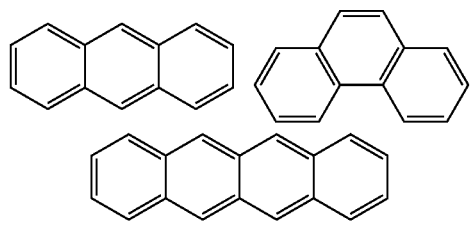

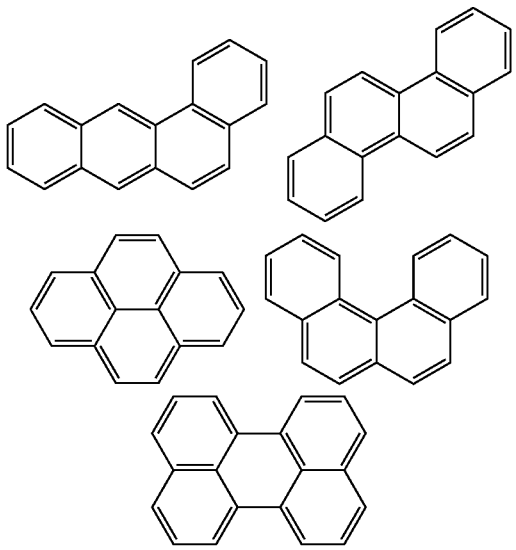

(5) The negative resist composition as set forth in any one of (1) to (4) above, wherein the actinic rays or radiations are any one of an excimer laser light having a wavelength of from 150 to 250 nm, electron beams, and X-rays.

DETAILED DESCRIPTION OF THE INVENTION

The compounds that are used in the invention will be hereunder described in detail.

[1] Alkali-Soluble Polymer (B) Used in the Invention:

As the alkali-soluble polymer that is used in the invention can be widely used polymers having a phenol skeleton, which have hitherto been disclosed as the chemically amplified resist, such as phenol novolak resins, polyvinyl phenol resins, copolymers having a vinyl phenol-derived structure unit, and resins obtained by partially protecting or modifying polyvinyl phenol resins. Of these are preferable phenol resins containing a recurring structure unit represented by the foregoing formula (b).

In the formula (b), $R_1$ represents a hydrogen atom, a halogen atom, a cyano group, or an optionally substituted alkyl group.

$R_2$ represents a hydrogen atom or an optionally substituted alkyl group, cycloalkyl group, aryl group, aralkyl group or acyl group.

$R_3$ and $R_4$, which may be the same or different, each represents a hydrogen atom, a halogen atom-, a cyano group, or an optionally substituted alkyl group, cycloalkyl group, alkenyl group, aralkyl group or aryl group. Incidentally, when $R_3$ and $R_4$ each represents a hydrogen atom, $R_3$ and $R_4$ do not constitute a substituent on the benzene ring.

A represents a simple bond, an optionally substituted alkylene group, alkenylene group, cycloalkylene group or arylene group, or —O—, —SO$_2$—, —O—CO—R$_5$—, —CO—O—R$_6$— or —CO—N(R$_7$) —R$_8$—.

$R_5$, $R_6$, and $R_8$, which may be the same or different, each represents a simple bond, an optionally substituted alkylene group, alkenylene group, cycloalkylene group or arylene group singly, or a divalent group formed from at least one of these groups taken together with at least one member selected from the group consisting of an ether structure, an ester structure, an amide structure, a urethane structure, and a ureido structure.

$R_7$ represents a hydrogen atom or an optionally substituted alkyl group, cycloalkyl group, aralkyl group or aryl group.

n represents an integer of from 1 to 3. Further, plural $R_2$'s, or $R_2$ and $R_3$ or $R_4$, may be bound to each other to form a ring.

As the alkyl group represented by $R_1$ to $R_4$ and $R_7$ are enumerated alkyl groups having from 1 to 8 carbon atoms. Specifically, preferred examples include a methyl group, an ethyl group, a propyl group, an n-butyl group, a sec-butyl group, a hexyl group, a 2-ethylhexyl group, and an octyl group.

The cycloalkyl group represented by $R_2$ to $R_4$ and $R_7$ may be of a monocyclic type or a polycyclic type. Examples of monocyclic type are those having from 3 to 8 carbon atoms, and preferably include a cyclopropyl group, a cyclopentyl group, and a cyclohexyl group. Preferred examples of the polycyclic type include an adamantly group, a norbornyl group, an isoboronyl group, a dicyclopentyl group, an α-pinel group, and a tricyclodecanyl group.

As the alkenyl group represented by $R_3$ and $R_4$ are enumerated alkenyl groups having from 2 to 8 carbon atoms. Specifically, preferred examples include a vinyl group, an allyl group, a butenyl group, and a cyclohexenyl group.

As the aryl group represented by $R_2$ to $R_4$ and $R_7$ are enumerated aryl groups having from 6 to 15 carbon atoms. Specifically, preferred examples include a phenyl group, a tolyl group, a dimethylphenyl group, a 2,4,6-trimethylphenyl group, a naphthyl group, and an anthryl group.

As the aralkyl group represented by $R_2$ to $R_4$ and $R_7$ are enumerated aralkyl groups having from 7 to 12 carbon atoms. Specifically, preferred examples include a benzyl group, a phenethyl group, and a naphthylmethyl group.

As the acyl group represented by $R_2$ are enumerated acyl groups having from 1 to 8 carbon atoms. Specifically, preferred examples include a formyl group, an acetyl group, a propanoyl group, a butanoyl group, a pivaloyl group, and a benzoyl group.

As the alkylene group represented by A, $R_5$, $R_6$, and $R_8$ are preferably enumerated optionally substituted alkylene groups having from 1 to 8 carbon atoms, such as a methylene group, an ethylene group, a propylene group, a butylene group, a hexylene group, and an octylene group.

As the alkenylene group represented by A, $R_5$, $R_6$, and $R_8$ are preferably enumerated optionally substituted alkenylene groups having from 2 to 6 carbon atoms, such as an ethenylene group, a propenylene group, and a butenylene group.

As the cycloalkylene group represented by A, $R_5$, $R_6$, and $R_8$ are preferably enumerated optionally substituted cycloalkylene groups having from 5 to 8 carbon atoms, such as a cyclopentylene group and a cyclohexylene group.

As the arylene group represented by A, $R_5$, $R_6$, and $R_8$ are preferably enumerated arylene groups having from 6 to 12 carbon atoms, such as a phenylene group, a tolylene group, and a naphthylene group.

The above-described alkyl group, cycloalkyl group, aryl group, aralkyl group, acyl group, alkenyl group, alkylene group, alkenylene group, cycloalkylene group, and arylene group may each have a substituent.

Examples of the substituent include those having active hydrogen (such as an amino group, an amide group a ureido group, a urethane group, a hydroxyl group, and a carboxyl group); halogen atoms (such as a fluorine atom, a chlorine atom, a bromine atom, and an iodine atom); alkoxy groups (such as a methoxy group, an ethoxy group, a propoxy group, and a butoxy group); a thioether group; acyl groups (such as an acetyl group, a propanoyl group, and a benzoyl group); acyloxy groups (such as an acetoxy group, a propanoyloxy group, and a benzoyloxy group); alkoxycarbonyl groups (such as a methoxycarbonyl group, an ethoxycarbonyl group, and a propoxycarbonyl group); a cyano group; and a nitro group. Of these are particularly preferable those having active hydrogen, including an amino group, a hydroxyl group, and a carboxyl group.

As the ring formed by bonding plural $R_2$'s, or $R_2$ and $R_3$ or $R_4$ are enumerated 4- to 7-membered rings containing an oxygen atom, such as a benzofuran ring, a benzodioxonol ring, and a benzopyran ring.

The resin (B) of the invention may be a resin comprising only the recurring structure unit represented by the formula (b), or may be copolymerized with other polymerizable monomer for the purpose of enhancing the performance of the negative resist of the invention.

As the polymerizable monomer that can be used are enumerated compounds having one addition polymerizable unsaturated bond, which are selected from compounds other than those described above, such as acrylic acid esters, acrylamides, methacrylic-acid esters, methacrylamides, allyl compounds, vinyl ethers, vinyl esters, styrenes, and crotonic acid esters.

Specifically, there are enumerated acrylic acid esters including alkyl acrylates in which the alkyl group preferably has from 1 to 10 carbon atoms (such as methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate, and tetrahydrofurfuryl acrylate) and aryl acrylates (such as phenyl acrylate); methacrylic acid esters including alkyl methacrylates in which the alkyl group preferably has from 1 to 10 carbon atoms (such as methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylol-propane monomethacrylate, pentaerythritol monomethacrylate, glycidyl methacrylate, furfuryl methacrylate, and tetrahydrofurfuryl methacrylate) and aryl methacrylates (such as phenyl methacrylate, cresyl methacrylate, and naphthyl methacrylate); acrylamides including acrylamide, N-alkylacrylamides (in which the alkyl group has from 1 to 10 carbon atoms, such as a methyl group, an ethyl group, a propyl group, a butyl group, a t-butyl group, a heptyl group, an octyl group, a cyclohexyl group, a benzyl group, a hydroxyethyl group, and a benzyl group), N-arylacrylamides (examples of the aryl group include a phenyl group, a tolyl group, a nitrophenyl group, a naphthyl group, a cyanophenyl group, a hydroxyphenyl group, and carboxyphenyl group), N,N-dialkylacrylamides (in which the alkyl group has from 1 to 10 carbon atoms, such as a methyl group, an ethyl group, a butyl group, an isobutyl group, an ethylhexyl group, and a cyclohexyl group), N,N-diarylacrylamides (examples of the aryl group include a phenyl group), N-methyl-N-phenylacrylamide, N-hydroxyethyl-N-methylacrylamide, and N-2- acetamidoethyl-N-acetylacrylamide; methacrylamides including methacrylamide, N-alkylmethacrylamides (in which the alkyl group has from 1 to 10 carbon atoms, such as a methyl group, an ethyl group, a t-butyl group, an ethylhexyl group, a hydroxyethyl group, and a cyclohexyl group), N-arylmethacrylamides (examples of the aryl group include a phenyl group), N,N-dialkylmethacrylamides (examples of the alkyl group include an ethyl group, a propyl group, and a butyl group), N,N-diarylmethacrylamides (examples of the aryl group include a phenyl group), N-hydroxyethyl-N-methylmethacrylamide, N-methyl-N-phenylmethacrylamide, and N-ethyl-N-phenylmethacrylamide; allyl compounds including ally esters (such as allyl acetate, allyl caproate, allyl caprylate, allyl laurate, allyl palmitate, allyl stearate, allyl benzoate, allyl acetoacetate, and allyl lactate) and allyloxyethanol; vinyl ethers including alkyl vinyl ethers (such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether) and vinyl aryl ethers (such as vinyl phenyl ether, vinyl tolyl ether, vinyl chlorophenyl ether, vinyl 2,4-dichlorophenyl ether, vinyl naphthyl ether, and vinyl anthranyl ether); vinyl esters including vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate, and vinyl naphthoate; styrenes including styrene, alkylstyrenes (such as methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene), alkoxystyrenes (such as methoxystyrene, 4-methoxy-3-methylstyrene, and dimethoxystyrene), halogen styrenes (such as chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bormo-4-trifluoromethylstyrene, and 4-fluoro-3-trifluoromethylstyrene), and carboxystyrene; crotonic acid esters including alkyl crotonates (such as butyl crotonate, hexyl crotonate, and glycerin monocrotonate); dialkyl itaconates (such as dimethyl itaconate, diethyl itaconate, and dibutyl itaconate); dialkyl esters of maleic acid or fumaric acid (such as dimethyl maleate and dibutyl fumarate); maleic anhydride; maleimide; acrylonitrile; methacrylonitrile; and maleylonitrile. Besides, addition polymerizable unsaturated compounds that are generally copolymerizable are also employable.

Of these, monomers capable of enhancing the alkali solubility, such as carboxyl group-containing monomers including carboxystyrene, N-(carboxyphenyl)acrylamide, and N-(carboxyphenyl)methacrylamide, and maleimide are preferable as the copolymerization component.

A content of other polymerizable monomer in the resin of the invention is preferably 50% by mole or less, and more preferably 30% by more or less with respect to the whole of the recurring units.

Specific examples of the resin having the recurring structure unit represented by the formula (b) will be given below, but it should not be construed that the invention is limited thereto.

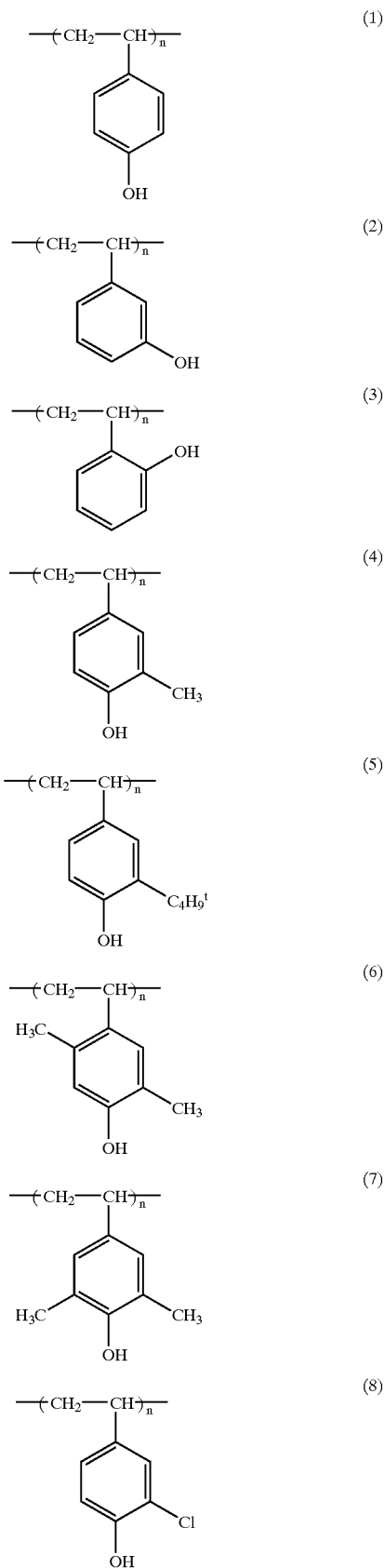

(9)
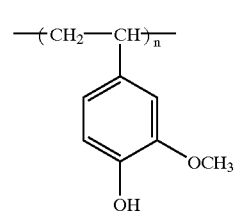
(10)
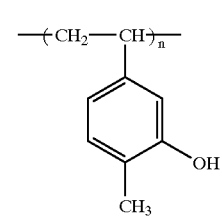
(11)
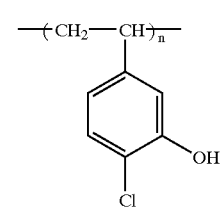
(12)
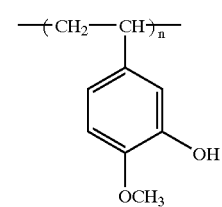
(13)
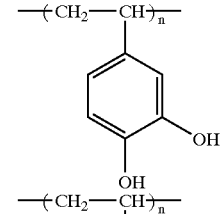
(14)
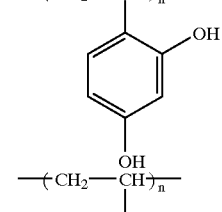
(15)
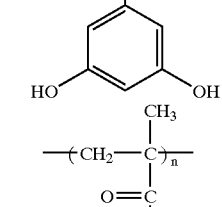
(16)
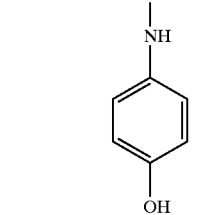
-continued
(17)
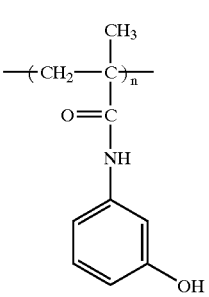
(18)
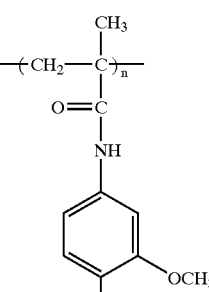
(19)
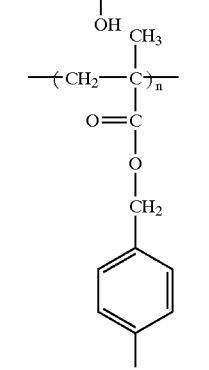
(20)
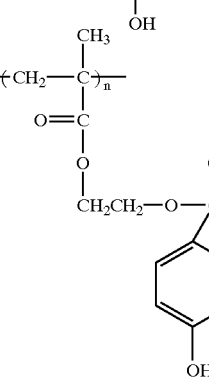
(21)
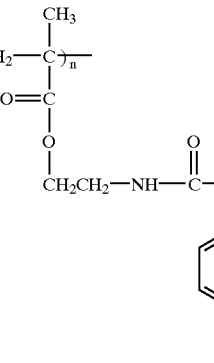

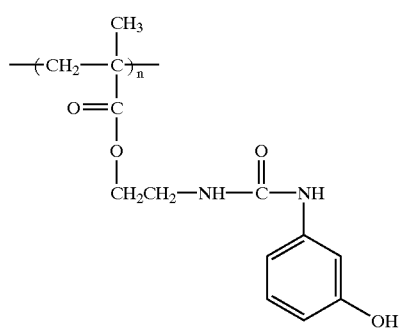
(22)
(23)
(24)
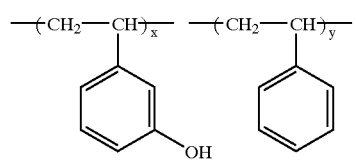
(28)
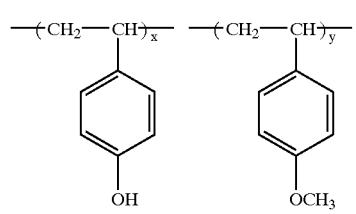
(29)
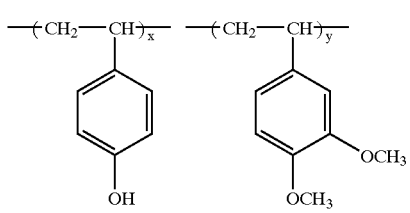
(30)
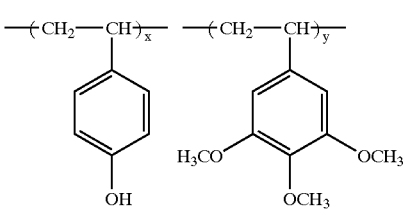
(31)
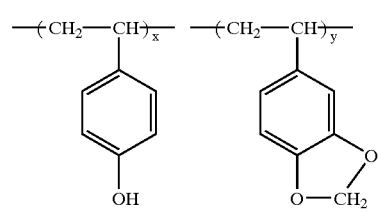
(32)
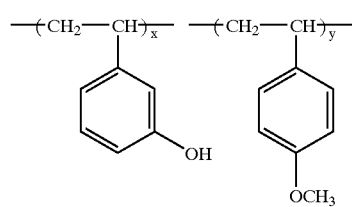
(33)
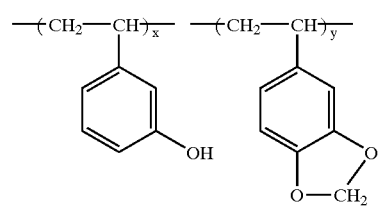
(34)
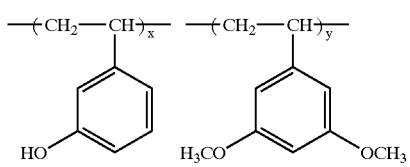
(35)
(25)
(26)
(27)

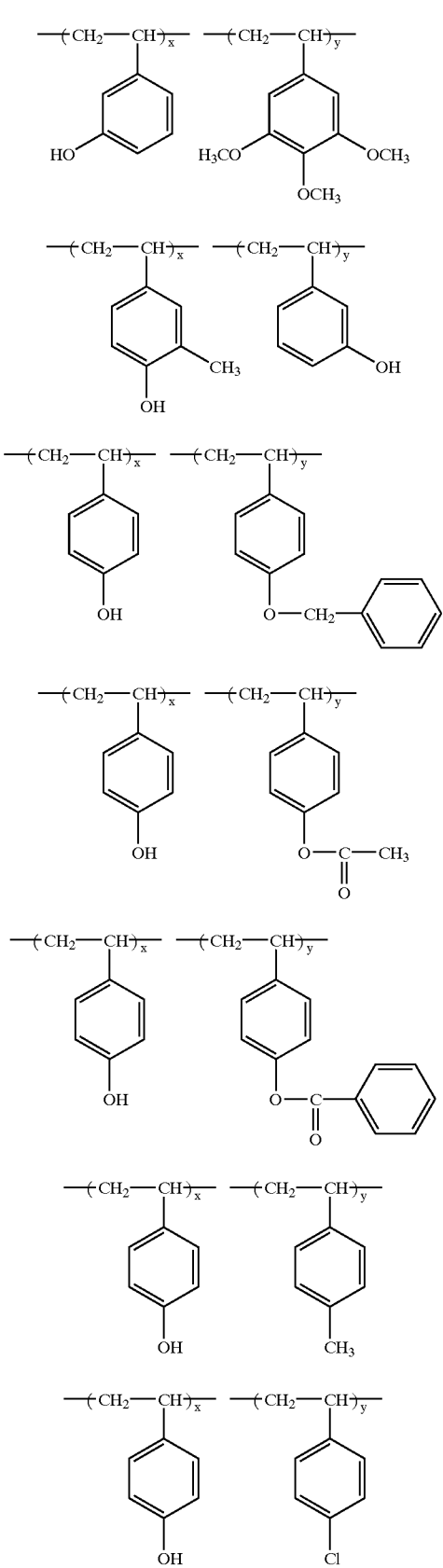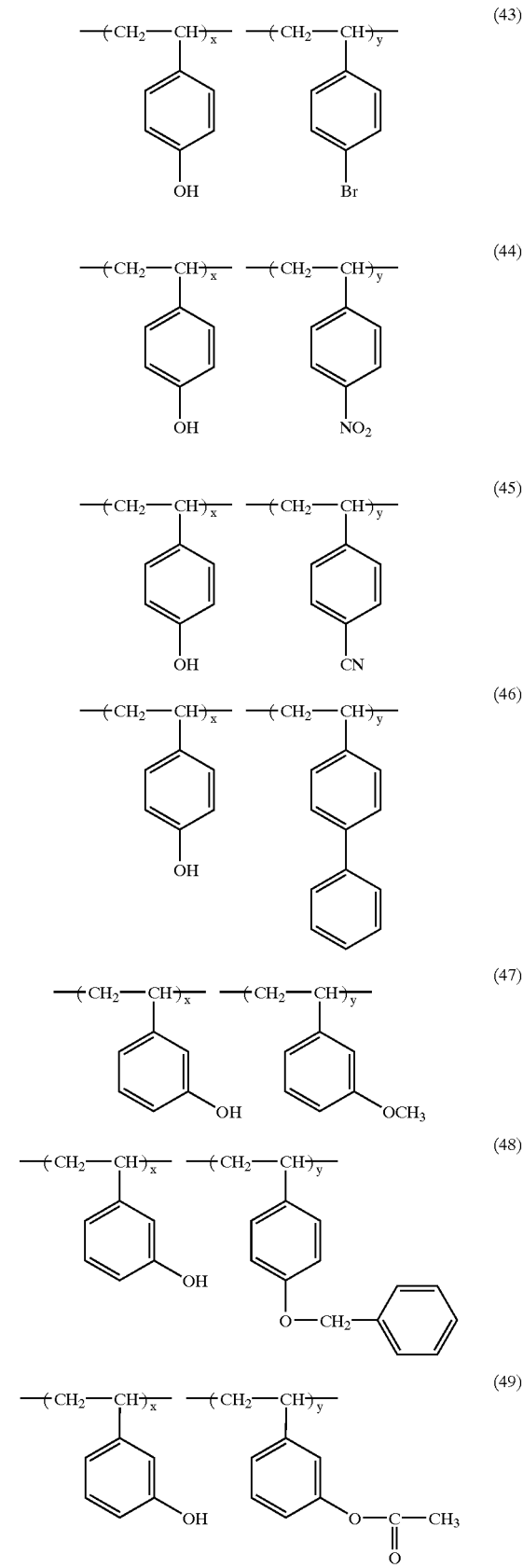

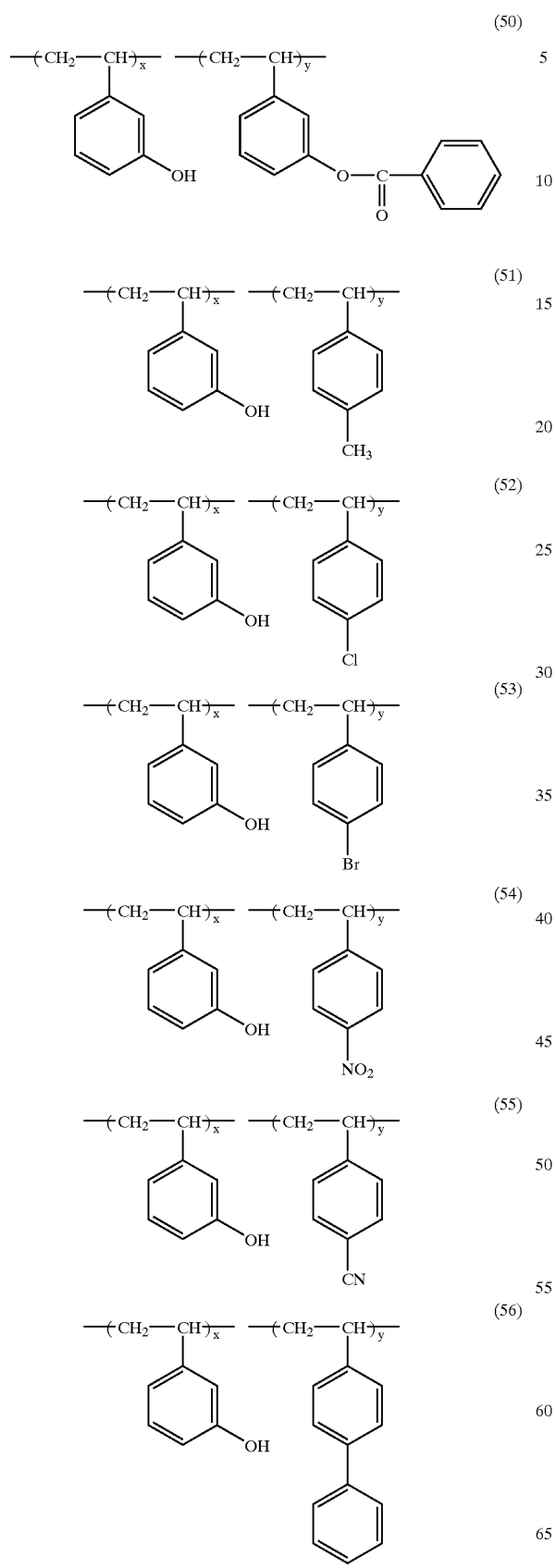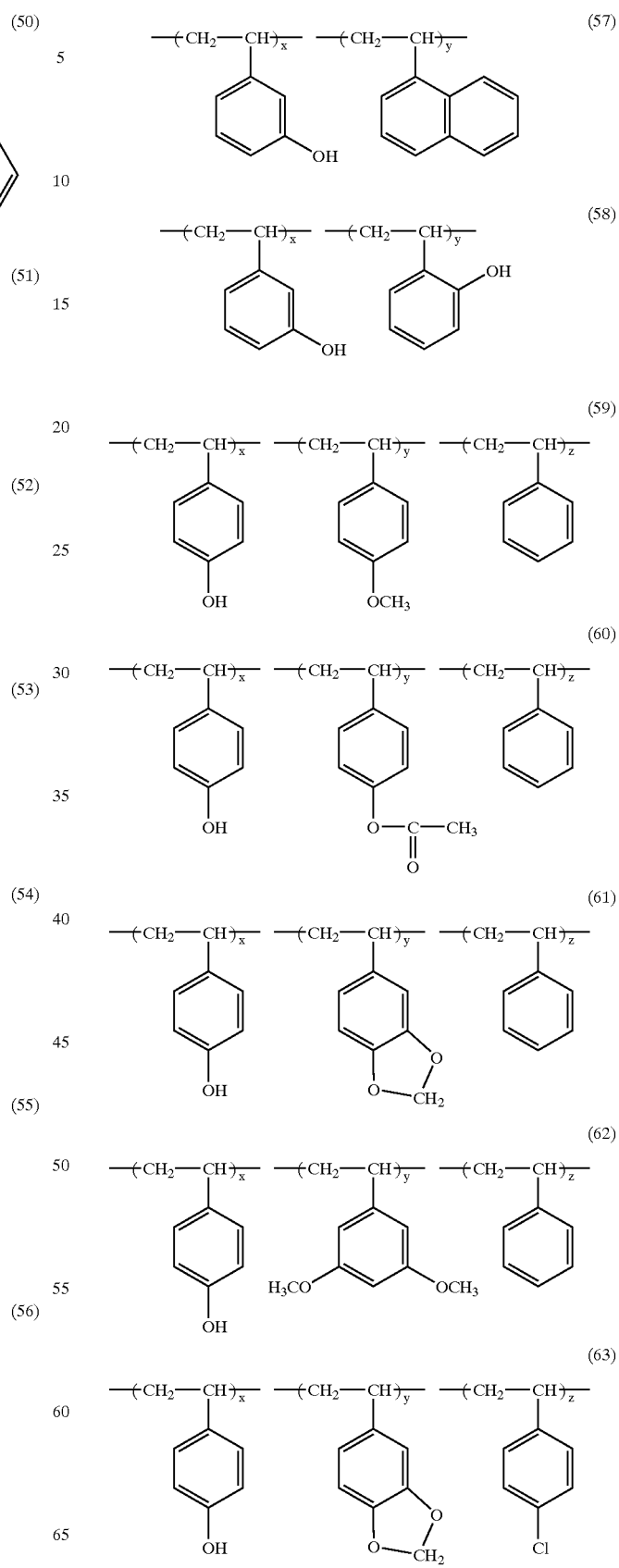

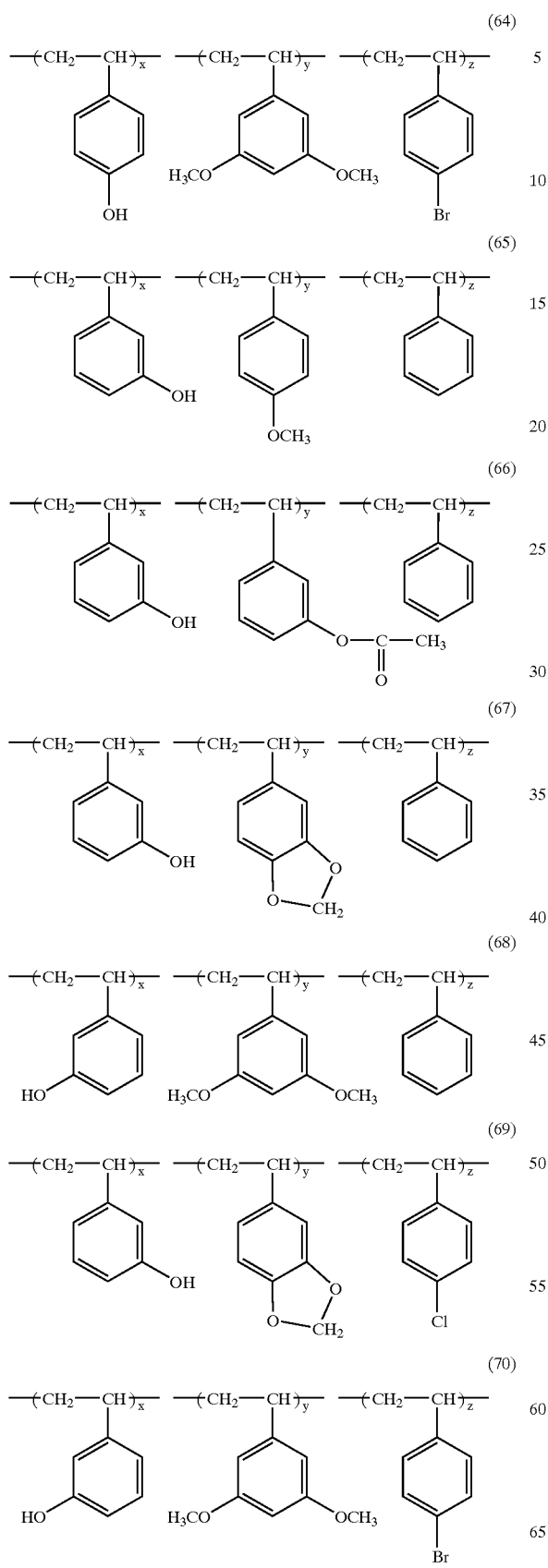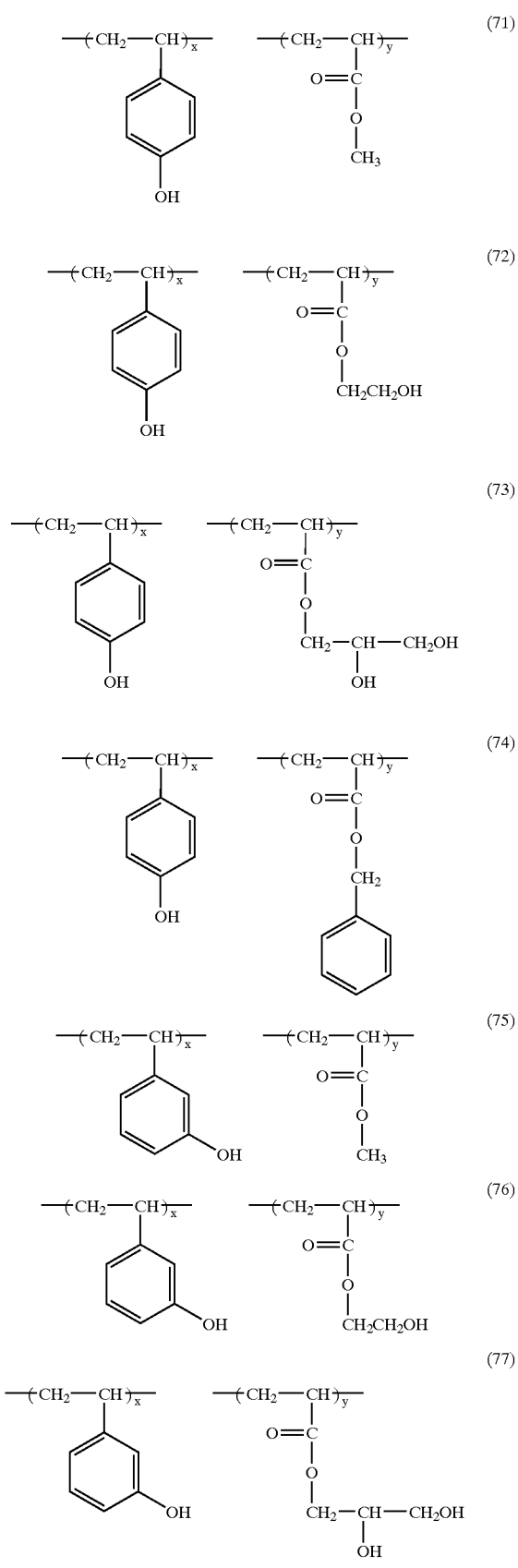

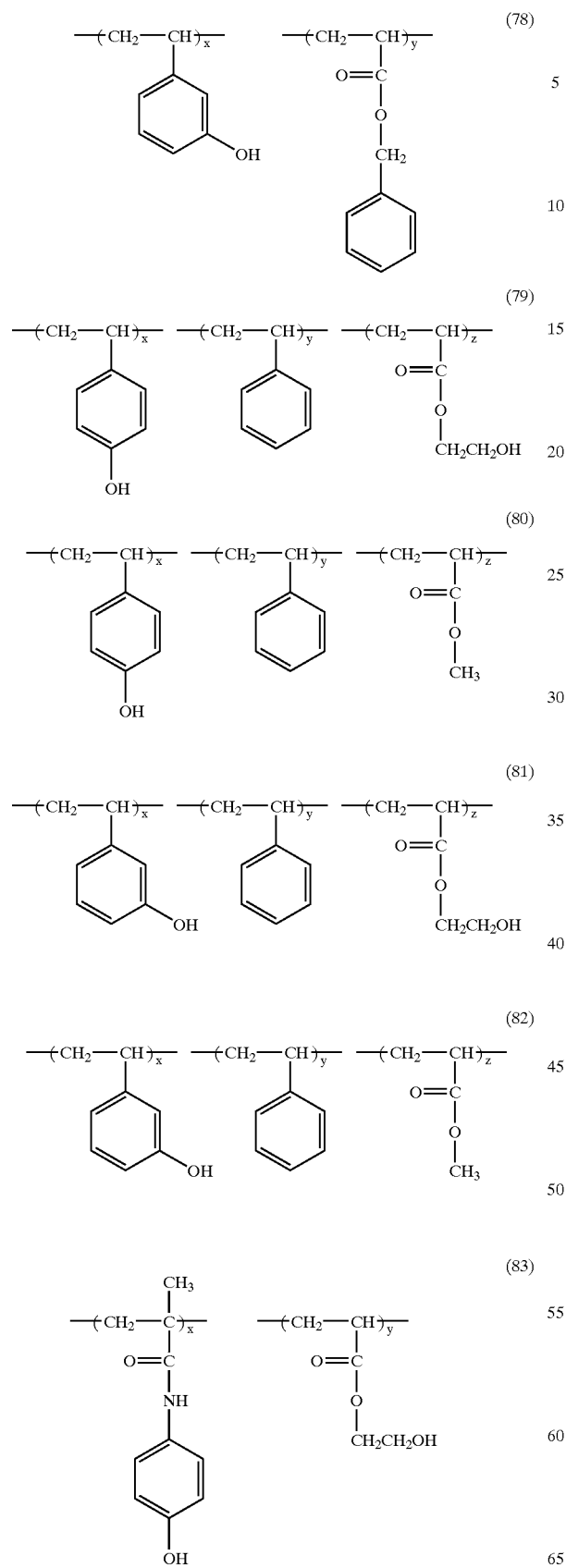
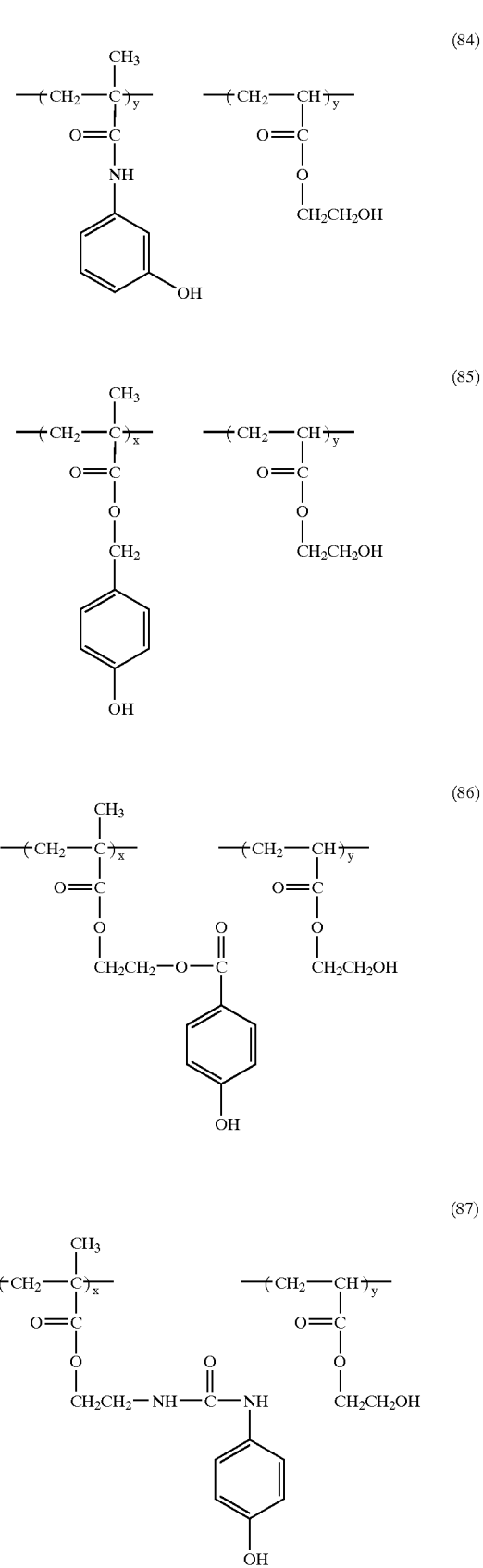

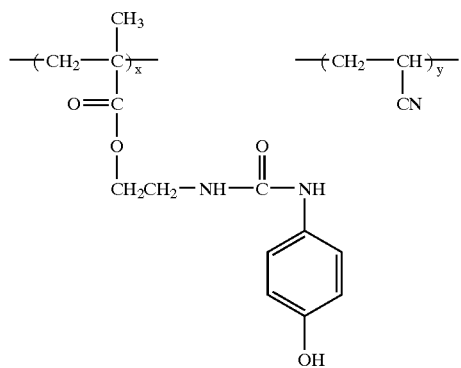
(88)

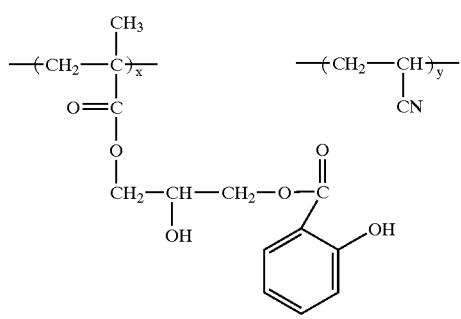
(89)

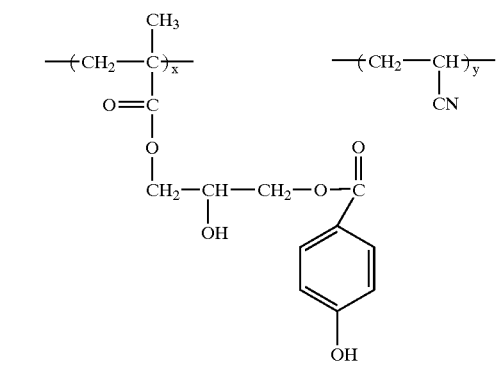
(90)

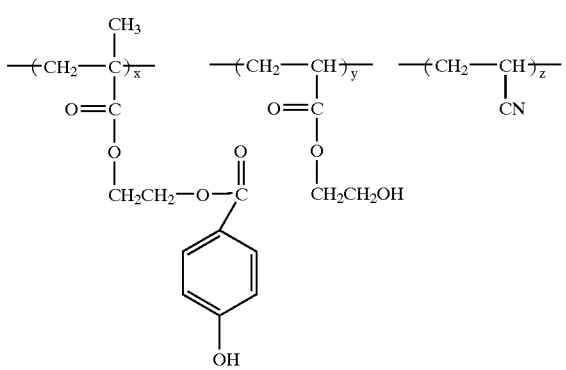
(91)

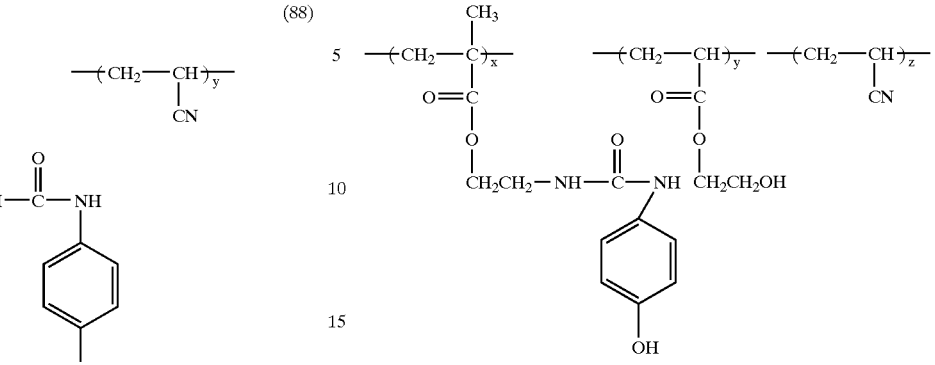
(92)

In the foregoing specific examples, n represents a positive integer x, y, and z each represents a molar ratio of the resin composition; in the case of a resin comprising two components, x and y range from 10 to 95 and from 5 to 90, respectively, and preferably from 40 to 90 and from 60 to 10, respectively; and in the case of a resin comprising three components, x, y and z range from 10 to 90, from 5 to 85 and from 5 to 85, respectively, and preferably from 40 to 80, from 10 to 50 and from 10 to 50, respectively.

A molecular weight of the resin (B) having the recurring structure unit represented by the formula (b) is preferably in the range of from 1,000 to 200,000, and more preferably from 3,000 to 50,000 in terms of weight average molecular weight; and its molecular weight distribution is in the range of from 1 to 10, preferably from 1 to 3, and more preferably from 1 to 1.5. As the molecular weight distribution becomes small, the resolution, the resist shape, and sidewalls of the resist pattern are smooth, and the roughness properties are superior.

A content of the recurring structure unit represented by the formula (b) is from 5 to 100% by mole, and preferably from 10 to 90% by mole with respect to the entire resin.

The alkali-soluble polymer containing the recurring structure unit represented by the formula (b), which is used in the invention, can be synthesized by the methods as described in Macromolecules (1995), 28(11), 3787-3789, *Polym. Bull.* (Berlin) (1990), 24(4), 385-389, and JP-A-8-286375. Specifically, the desired alkali-soluble polymer can be obtained by the radical polymerization or living anionic polymerization method.

These resins may be used singly or in admixture.

The weight average molecular weight as referred to herein is defined in terms of polystyrene reduced value of the gel permeation chromatography.

An alkali dissolution rate of the alkali-soluble polymer is preferably 20 angstroms per second or more, and particularly preferably 200 angstroms per second or more when measured (at 23° C.) in 0.261N tetramethylammonium hydroxide (TMAH).

The alkali-soluble polymer of the invention may be used singly or in combination with other alkali-soluble polymer. The alkali-soluble polymer other than that of the invention may be used in an amount of up to 100 parts by weight at maximum based on 100 parts by weight of the alkali-soluble polymer of the invention.

Examples of the alkali-soluble polymer that can be used in combination will be given below.

Examples include novolak resins, hydrogenated novolak resins, acetone-pyrogallol resins, styrene-maleic anhydride copolymers, carboxyl group-containing methacrylic resins, and derivatives thereof, but it should not be construed that the invention is limited thereto.

An amount of the resin (B) to be added is in the range of from 30 to 95% by weight, preferably from 40 to 90% by weight, and more preferably from 50 to 80% by weight with respect to the total solids content of the composition.

The alkali-soluble polymer as the component (B) to be used in the invention is preferably one having either one recurring unit represented by the formula (b-2) or (b-3).

In the formulae (b-2) and (b-3), $R_1$ is synonymous with $R_1$ in the formula (b).

A is synonymous with A in the formula (b).

$R_{101}$ to $R_{106}$ each independently represents a hydroxyl group, a carboxy group, an amino group, or an optionally substituted alkyl group, cycloalkyl group, alkoxy group, alkylcarbonyloxy group, alkylsulfonyloxy group, alkenyl group, aryl group, aralkyl group, N-alkylamino group or N-dialkylamino group; preferably a hydroxyl group, a linear or branched alkyl group having from 1 to 6 carbon atoms, an alkoxy group having from 1 to 6 carbon atoms, an alkylcarbonyloxy group having from 1 to 6 carbon atoms, or a phenyl group; and more preferably a hydroxyl group, a linear or branched alkyl group having from 1 to 4 carbon atoms (such as a methyl group, an ethyl group, an n-propyl group, an n-butyl group, and a t-butyl group), an alkoxy group having from 1 to 3 carbon atoms (such as a methoxy group and an ethoxy group), or a phenyl group a to f each independently represents an integer of from 0 to 3, and preferably an integer of from 0 to 2.

As the alkyl group and the alkyl group in the alkoxy group, alkylcarbonyloxy group, alkylsulfonyloxy group, N-alkylamino group, and N-dialkylamino group are enumerated linear or branched alkyl groups. Preferred examples include a methyl group, an ethyl group, a propyl group, an n-butyl group, a sec-butyl group, a hexyl group, a 2-ethylhexyl group, and an octyl group. The cycloalkyl group may be of a monocyclic type or a polycyclic type. As the monocyclic type can be preferably enumerated a cyclopropyl group, a cyclopentyl group, and a cyclohexyl group. As the polycyclic type can-be preferably enumerated an adamantly group, a norbornyl group, an isoboronyl group, a dicyclopentyl group, an α-pinel group, and a tricyclodecanyl group.

As the alkenyl group can be preferably enumerated a vinyl group, an allyl group, a butenyl group, and a cyclohexenyl group.

As the aryl group can be preferably enumerated a phenyl group, a tolyl group, a dimethylphenyl group, a 2,4,6-trimethylphenyl group, a naphthyl group, and an anthryl group.

As the aralkyl group can be preferably enumerated a benzyl group, a phenethyl group, and a naphthylmethyl group.

Y represents any one of the foregoing fused polycyclic aromatic structures.

In the fused polycyclic aromatic structures represented by Y, the position of the bond binding to the main chain, or the position of the bond binding to a substituent, may be any position of the bonds on the fused polycyclic aromatic structure.

The above-described alkyl group, cycloalkyl group, aryl group, alkoxy group, alkylcarbonyloxy group, alkylsulfonyloxy group, aralkyl group, alkenyl group, N-alkylamino group, and N-dialkylamino group may each have a substituent.

Examples of the substituent include those having active hydrogen (such as an amino group, an amide group, a ureido group, a urethane group, a hydroxyl group, and a carboxyl group); halogen atoms (such as a fluorine atom, a chlorine atom, a bromine atom, and an iodine atom); alkoxy groups (such as a methoxy group, an ethoxy group, a propoxy group, and a butoxy group); a thioether group; acyl groups (such as an acetyl group, a propanoyl group, and a benzoyl group); acyloxy groups (such as an acetoxy group, a propanoyloxy group, and a benzoyloxy group); alkoxycarbonyl groups (such as a methoxycarbonyl group, an ethoxycarbonyl group, and a propoxycarbonyl group); a cyano group; and a nitro group.

A content of the recurring unit represented by the formulae (b-2) and/or (b-3) in the resin of the invention is preferably from 3 to 50% by mole, and more preferably from 5 to 40% by mole with respect to the total recurring units.

Examples of the alkali-soluble polymer having the fused polycyclic aromatic structure to be used in the invention will be given below, but it should not be construed that the invention is limited thereto.

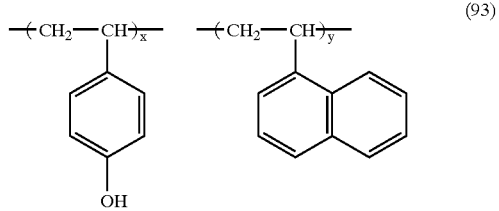

(93)

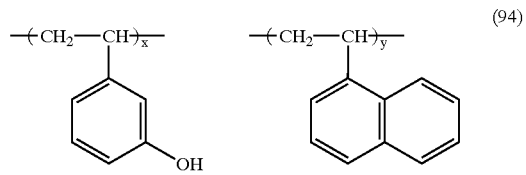

(94)

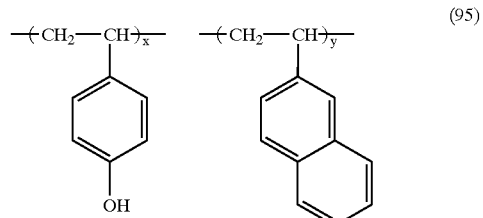

(95)

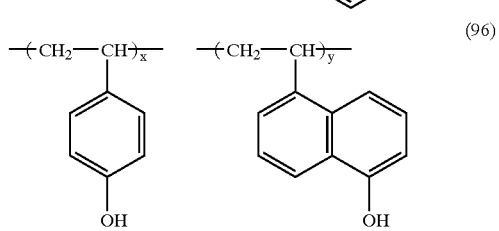

(96)

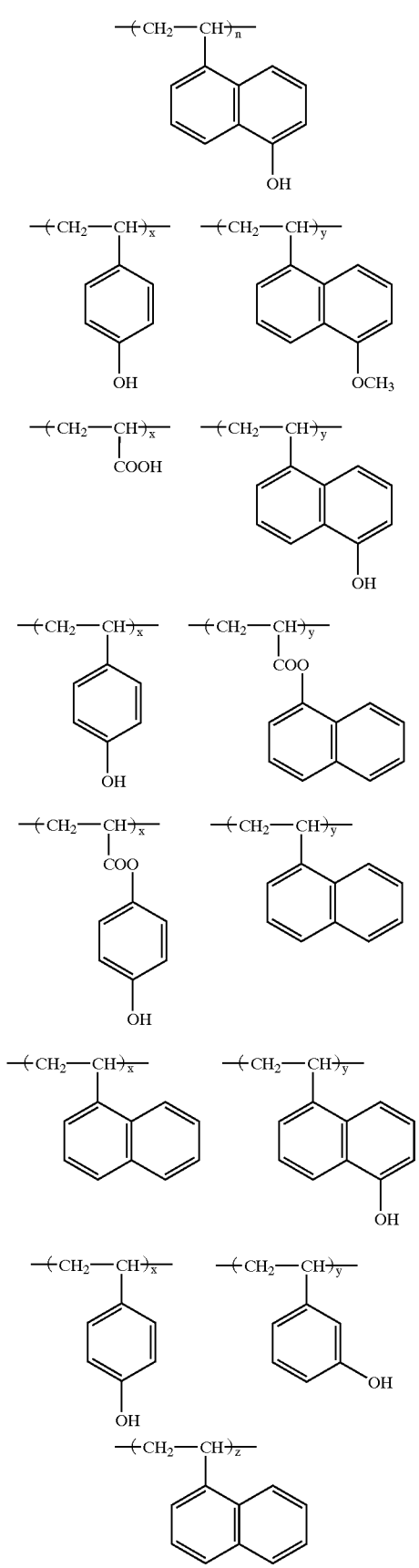
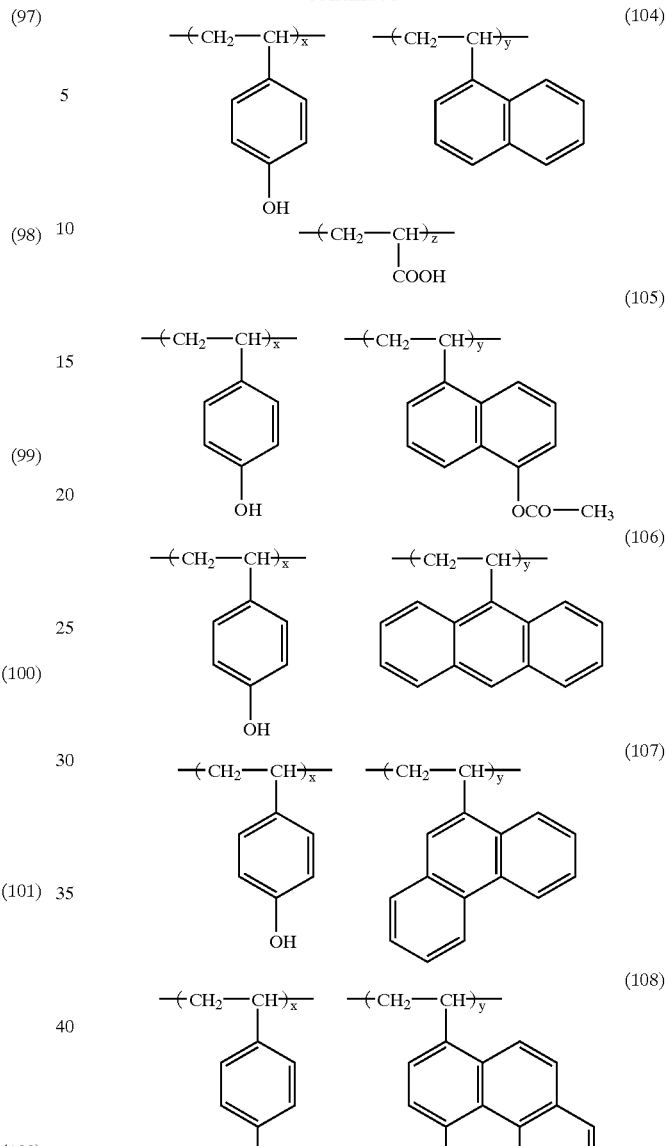

[2] Compound (A) of the Invention, which Generates an Acid Upon Irradiation with Actinic Rays or Radiations:

As the photo-acid generator that is used in the invention can be properly selected and used photo-initiators of photo-cationic polymerization, photo-initiators of photo-radical polymerization, photo-erasing agents of dyes, photo-discoloring agents, compounds which generate an acid by known lights used in micro-resists, etc. (such as ultraviolet rays of from 400 to 200 nm and far ultraviolet rays, and particularly preferably g-rays, h-rays, i-rays, and KrF excimer laser light), ArF excimer laser light, electron beams, X-rays, molecular beams, or ion beams, and mixtures thereof.

As other photo-acid generators that are used in the invention can be enumerated onium salts such as diazonium salts, ammonium salts, phosphonium salts, iodonium salts, sulfonium salts, selenonium salts, and arsonium salts, organic halides, organometallic/organic halides, photo-acid generators having an o-nitrobenzyl type protective group, compounds which generate sulfonic acid upon photodecomposition, represented by iminosulfonate, disulfone compounds, diazoketosulfulone, and diazodisulfone compounds.

Also, compounds having a group or a compound, which generates an acid by light, introduced into a main chain or side chains of the polymer can be used.

In addition, the compounds generating an acid by light, as described in, for example, V. N. R. Pillai, *Synthesis*, (1), 1 (1980), A. Abad, et al., *Tetrahedron Lett.*, (47), 4555 (1971) D. H. R. Barton, et al., *J. Chem. Soc.*, (C), 329 (1970), U.S. Pat. No. 3,779,778, and European Patent 126,712 can be used.

With respect to the photo-acid generator (A), those which are particularly effectively used will be described with reference to the following <A-1> to <A-4>.

<A-1> Oxazole derivatives represented by the following formula (PAG 1) or S-triazine derivatives represented by the following formula (PAG 2), each having a trihalomethyl group substituted therein:

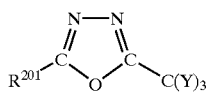

(PAG1)

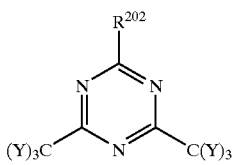

(PAG2)

In the formulae, $R^{201}$ represents a substituted or unsubstituted aryl group or alkenyl group; $R^{202}$ represents a substituted or unsubstituted aryl group, alkenyl group or alkyl group, or —C(Y)$_3$; and Y represents a chlorine atom or a bromine atom.

Specific examples will be given below, but it should not be construed that the invention is limited thereto.

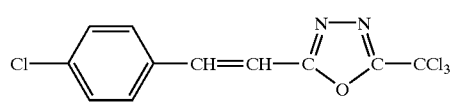

(PAG1-1)

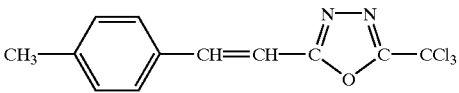

(PAG1-2)

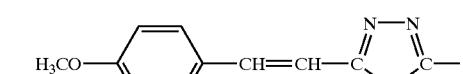

(PAG1-3)

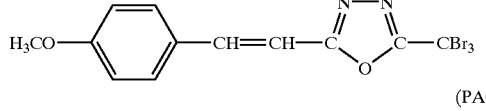

(PAG1-4)

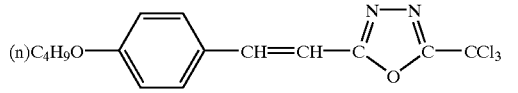

(PAG1-5)

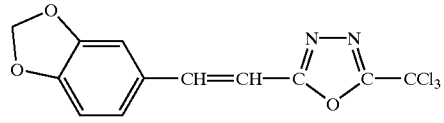

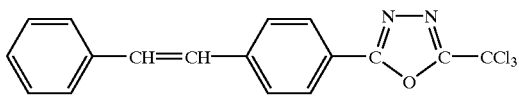

(PAG1-6)

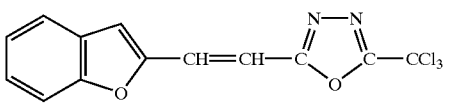

(PAG1-7)

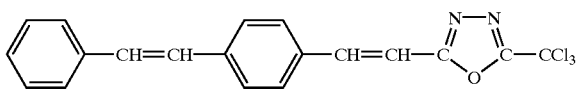

(PAG1-8)

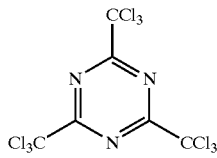

(PAG2-1)

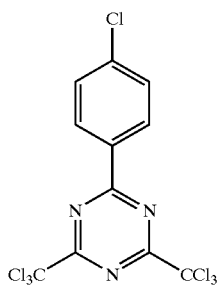

(PAG2-2)

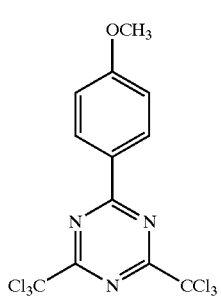

(PAG2-3)

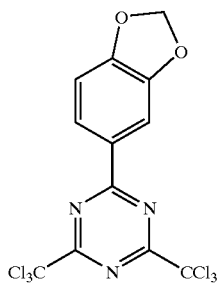

(PAG2-4)

(PAG2-5)
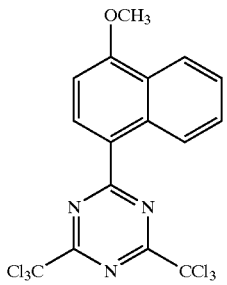

(PAG2-6)
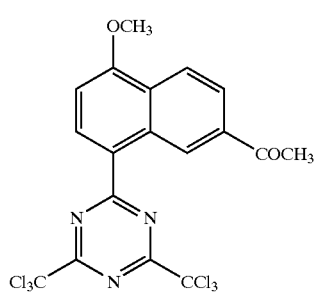

(PAG2-7)
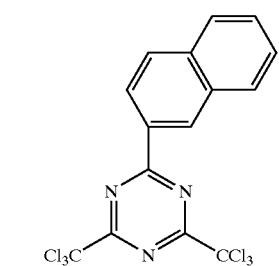

(PAG2-8)
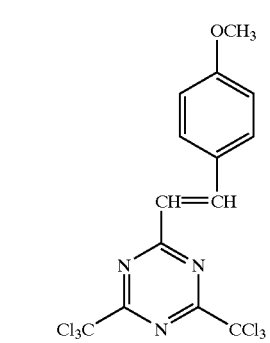

(PAG2-9)
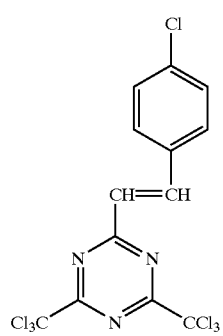

(PAG2-10)
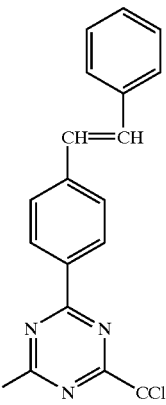

<A-2>Iodonium salts represented by the following formula (PAG 3) or sulfonium salts represented by the following formula (PAG 4):

(PAG3)
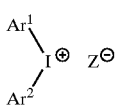

(PAG4)
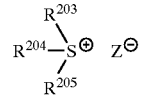

In the formulae, $Ar^1$ and $Ar^2$ each independently represents a substituted or unsubstituted aryl group; and $R^{203}$, $R^{204}$, and $R^{205}$ each independently represents a substituted or unsubstituted alkyl group or aryl group.

$Z^-$ represents a counter anion. Examples of the counter anion include perfluoroalkanesulfonic acid anions such as $BF_4^-$, $AsF_6^-$, $PF_6^-$, $SbF_6^-$, $SiF_6^{2-}$, $ClO_4^-$, and $CF_3SO_3^-$; alkylsulfonic acid anions such as a camphorsulfonic acid anion; aromatic sulfonic acid anions such as a pentafluorobenzenesulfonic acid anion, a benzenesulfonic acid anion, and a triisopropylbenzenesulfonic acid anion; fused polynucleic aromatic sulfonic acid anions such as a naphthalene-1-sulfonic acid anion; an anthraquinonesulfonic acid anion; and sulfonic acid group-containing dyes, but it should not be construed that the invention is limited thereto. Further, these anion species may further have a substituent.

Further, two of $R^{203}$, $R^{204}$ and $R^{205}$, and $Ar^1$ and $Ar^2$ may be bound to each other via a simple bond or a substituent.

Specific examples will be given below, but it should not be construed that the invention is limited thereto.

(PAG3-1)
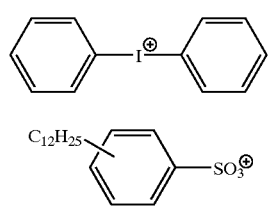
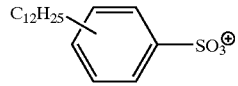

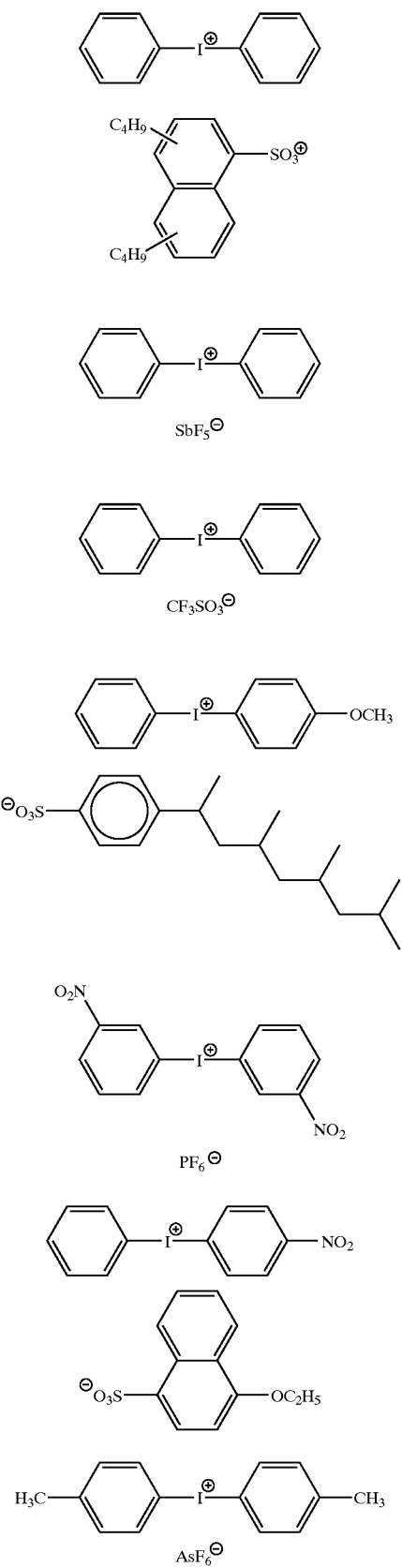
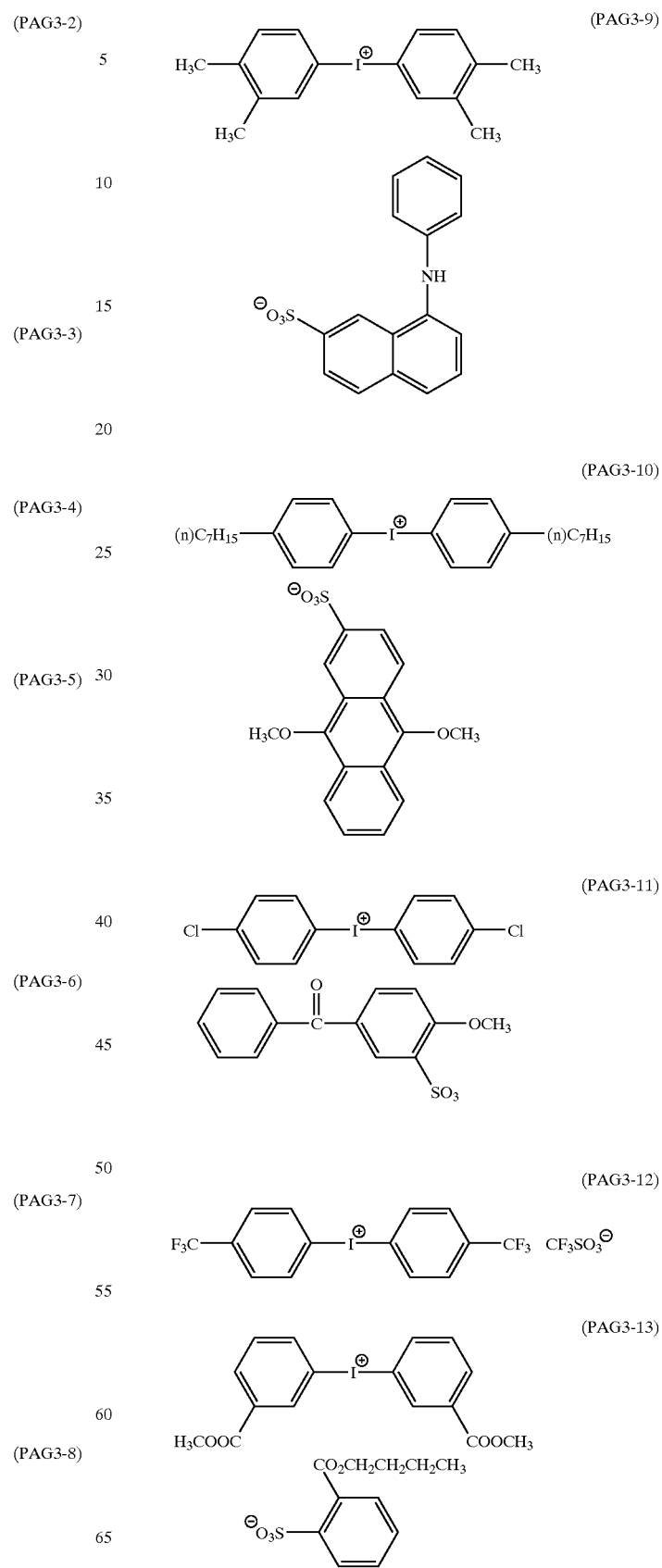

-continued
(PAG3-14)
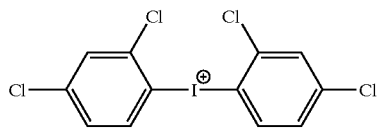
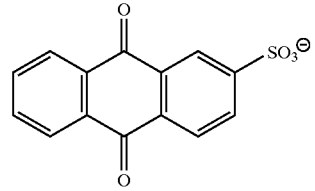
(PAG3-15)
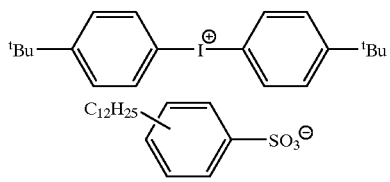
(PAG3-16)
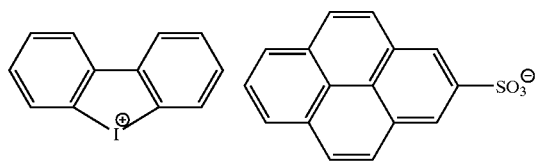
(PAG3-17)
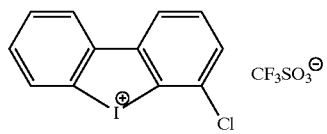
(PAG3-18)
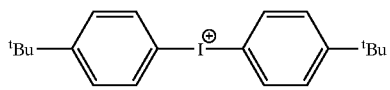
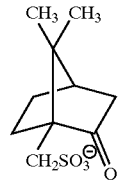
(PAG3-19)
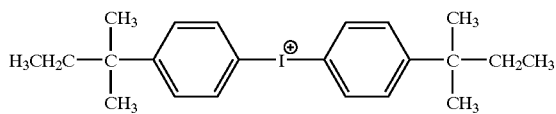
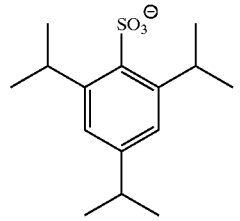
(PAG3-20)
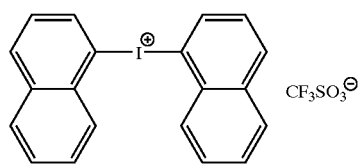
-continued
(PAG3-21)
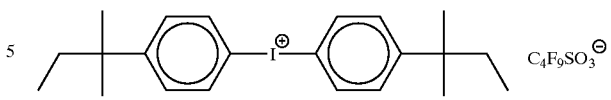 C$_4$F$_9$SO$_3^\ominus$
(PAG3-22)
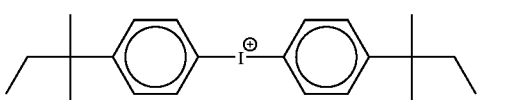
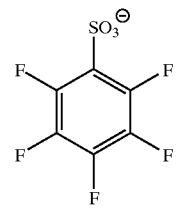
(PAG3-23)
CF$_3$SO$_3^\ominus$
(PAG3-24)
(PAG3-25)
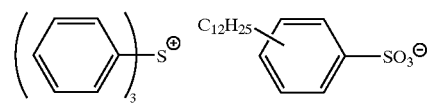
(PAG4-1)
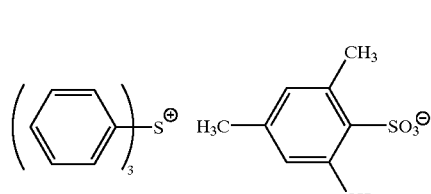
(PAG4-2)
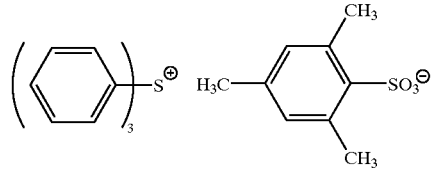
(PAG4-3)
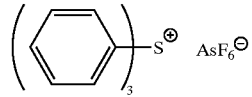 AsF$_6^\ominus$ -continued
(PAG4-4)
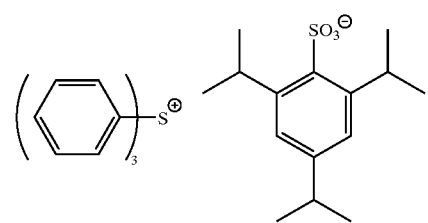
(PAG4-5)
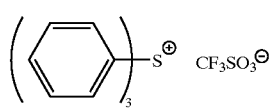
(PAG4-6)
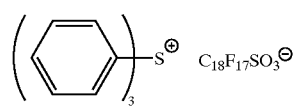
(PAG4-7)
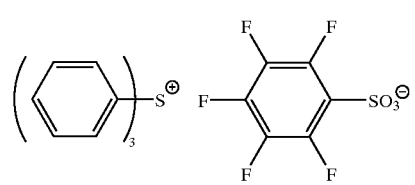
(PAG4-8)
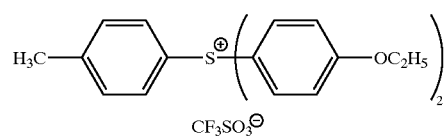
(PAG4-9)
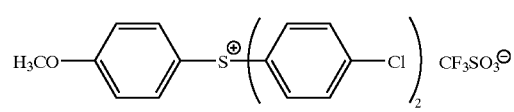
(PAG4-10)
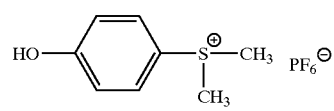
(PAG4-11)
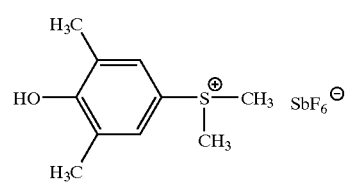
(PAG4-12)
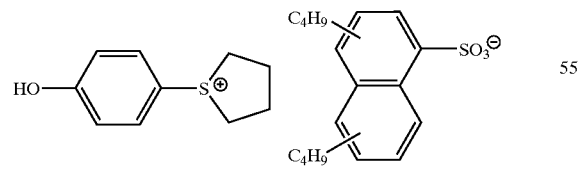
(PAG4-13)
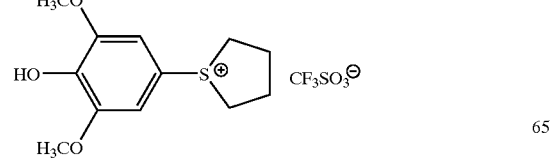
-continued
(PAG4-14)
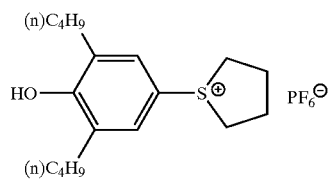
(PAG4-15)
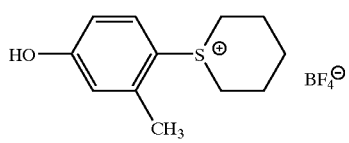
(PAG4-16)
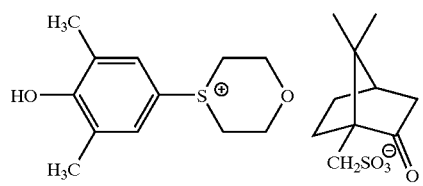
(PAG4-17)
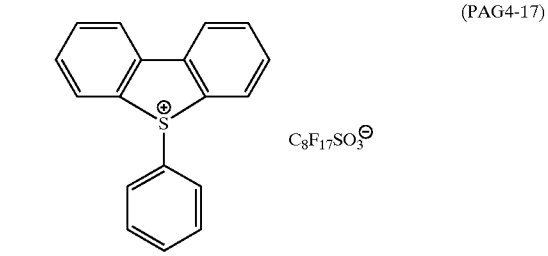
(PAG4-18)
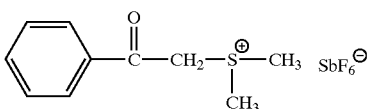
(PAG4-19)
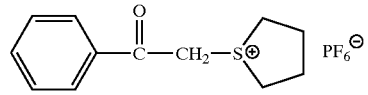
(PAG4-20)
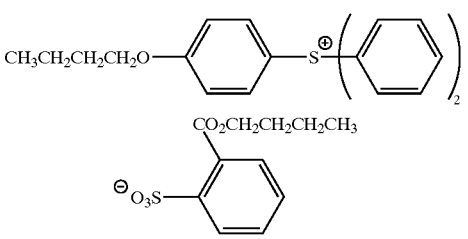
(PAG4-21)
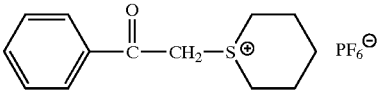
(PAG4-22)
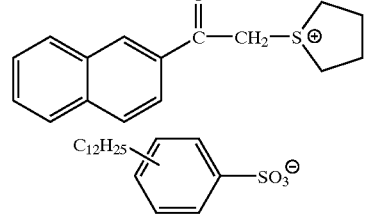

-continued (PAG4-23)

(PAG4-24)

(PAG4-25)

(PAG4-26)

(PAG4-27)

(PAG4-28)

(PAG4-29)

(PAG4-30)

(PAG4-31)

(PAG4-32)

(PAG4-33)

(PAG4-34)

(PAG4-35)

-continued (PAG4-36)
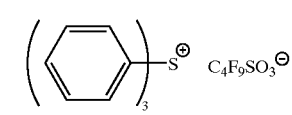

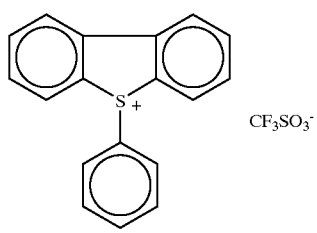

The onium salts represented by the formulae (PAG 3) and (PAG 4) are known and can be synthesized by the methods as described in, for example, J. W. Knapczyk, et al., *J. Am. Chem. Soc.*, 91, 145 (1969), A. L. Maycok, et al., *J. Org. Chem.*, 35, 2532 (1970), E. Goethas, et al., *Bull. Soc. Chem. Belg.*, 73, 546 (1964), H. M. Leicester, *J. Ame. Chem. Soc.*, 51, 3587 (1929) J. V. Crivello, et al., *J. Polym. Chem. Ed.*, 18, 2677 (1980), U.S. Pat. Nos. 2,807,648 and 4,247,473, and JP-A-53-101331.

<A-3> Disulfone derivatives represented by the following formula (PAG 5) or iminosulfonate derivatives represented by the following formula (PAG 6):

(PAG6)
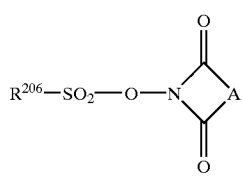

In the formulae, $Ar^3$ and $Ar^4$ each independently represents a substituted or unsubstituted aryl group; $R^{206}$ represents a substituted or unsubstituted alkyl group or aryl group; and A represents a substituted or unsubstituted alkylene group, alkenylene group or arylene group.

Specific examples will be given below, but it should not be construed that the invention is limited thereto.

(PAG5-1)
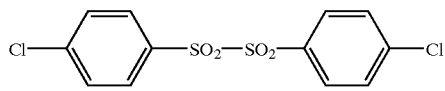

(PAG5-2)
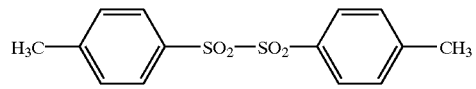

(PAG5-3)
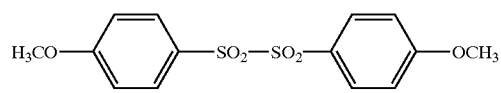

(PAG5-4)
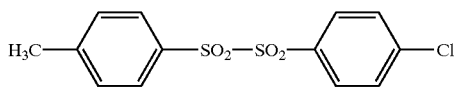

(PAG5-5)
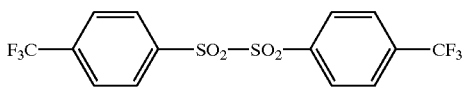

(PAG5-6)
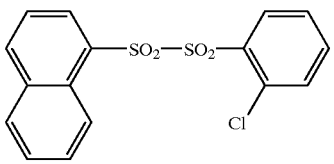

(PAG5-7)
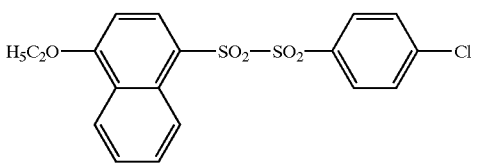

(PAG5-8)
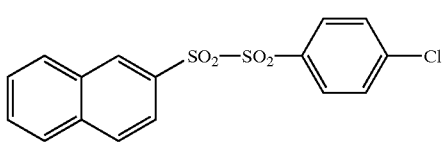

(PAG5-9)
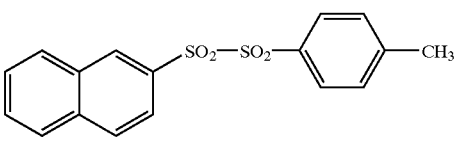

(PAG5-10)
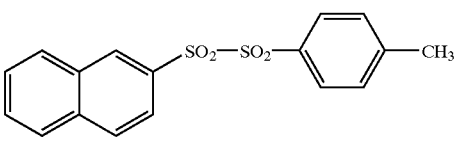

(PAG5-11)
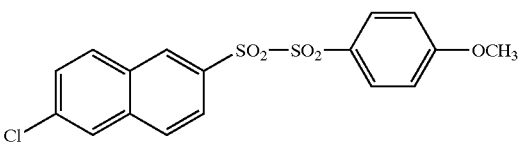

(PAG5-12)
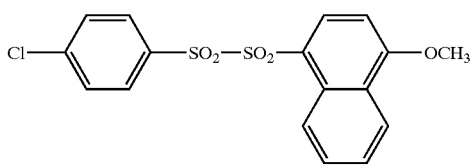

(PAG5-13)
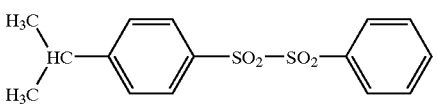

(PAG5-14)
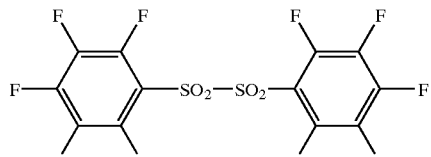

(PAG5-15)
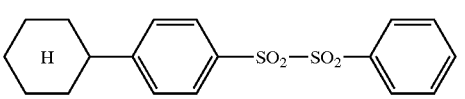
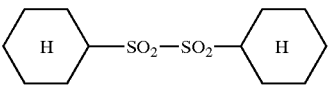

(PAG6-1)
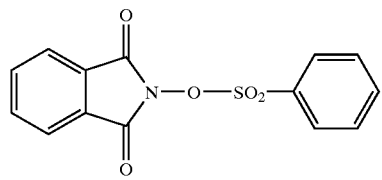
(PAG6-2)
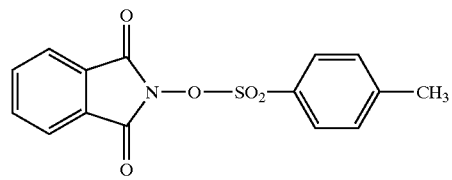
(PAG6-3)
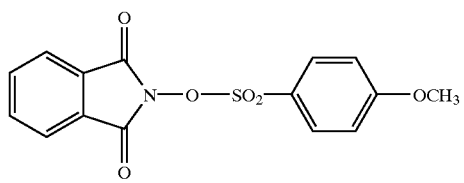
(PAG6-4)
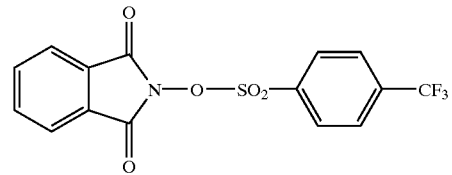
(PAG6-5)
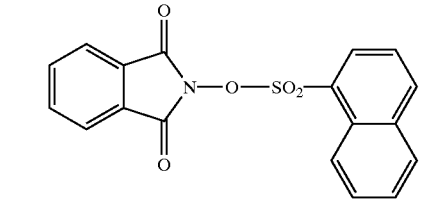
(PAG6-6)
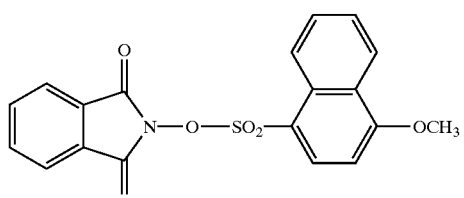
(PAG6-7)
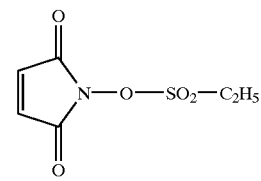
(PAG6-8)
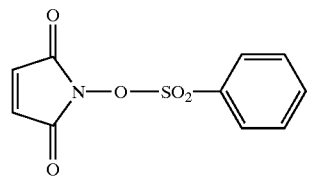
(PAG6-9)
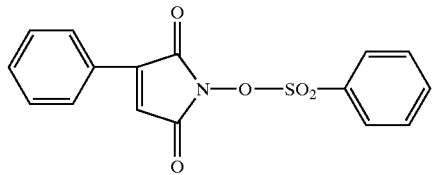
(PAG6-10)
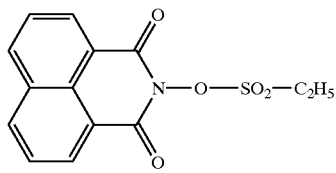
(PAG6-11)
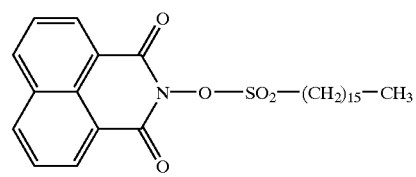
(PAG6-12)
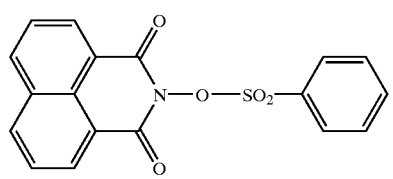
(PAG6-13)
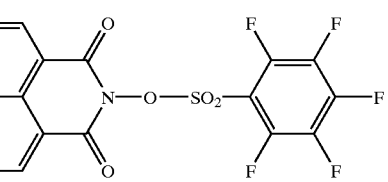
(PAG6-14)
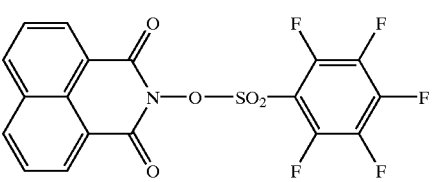
(PAG6-15)
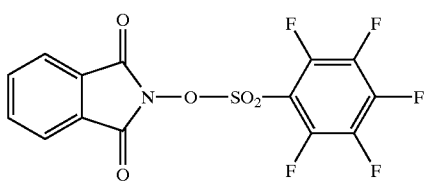
(PAG6-16)
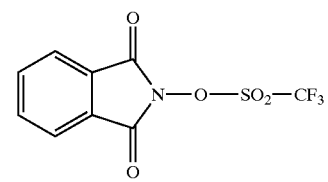

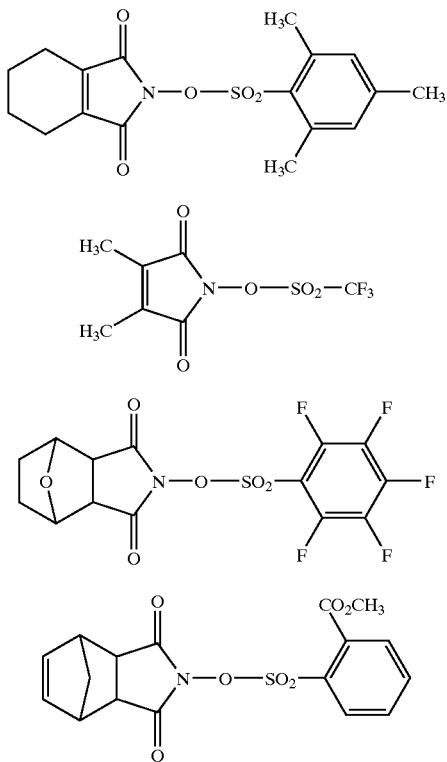

(PAG6-17)
(PAG6-18)
(PAG6-19)
(PAG6-20)

<A-4>Diazodisulfone derivatives represented by the following formula (PAG 7):

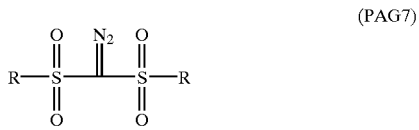

(PAG7)

In the formula, R represents a linear, branched or cyclic alkyl group or an optionally substituted aryl group.

Specific examples will be given below, but it should not be construed that the invention is limited thereto.

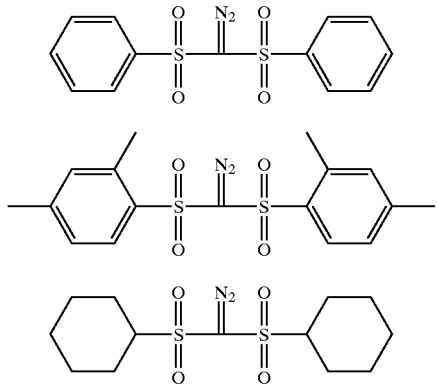

(PAG7-1)
(PAG7-2)
(PAG7-3)

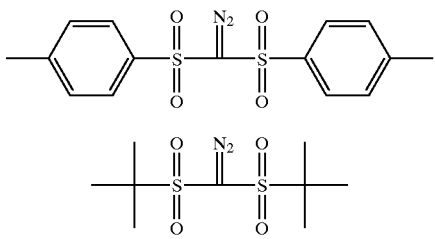

(PAG7-4)
(PAG7-5)

A content of the component (A) that is used in the invention is suitably from 0.1 to 30% by weight, preferably from 0.5 to 20% by weight, and more preferably from 1 to 15% by weight with respect to the solids content of the whole negative resist composition. When the content of the component (A) is less than 0.1% by weight, the sensitivity becomes low, whereas when it exceeds 30% by weight, the stability with laps of time is likely deteriorated, or the film forming properties are likely deteriorated, and hence, such is not preferable.

[3] Crosslinking Agent (C) which Generates Crosslinking with the Polymer (B) by the Action of an Acid:

In the negative resist composition according to the invention, a compound which undergoes crosslinking by an acid (this compound will be referred to properly as "acid crosslinking agent" or simply as "crosslinking agent") is used along with the alkali-soluble polymer and the photo-acid generator.

The crosslinking agent (C) of the invention contains at least two kinds of compounds having a different skeleton from each other, which are selected from phenol derivatives having two or more hydroxymethyl groups and/or alkoxymethyl groups on a benzene ring thereof, in which one kind of the crosslinking agent contains one or two benzene rings in the molecule thereof, and another kind of the crosslinking agent contains from 3 to 5 benzene rings in the molecule thereof.

[3]-1

As one kind of the crosslinking agent can be used phenol derivatives.

Preferably, can be enumerated a phenol derivative containing from 3 to 5 benzene rings and having two or more (in total) hydroxymethyl groups or alkoxymethyl groups in the molecule thereof, in which the hydroxymethyl groups and the alkoxymethyl groups are bound concentrically to at least any one of the benzene rings or dividedly to the benzene rings (this phenol derivative may be hereunder referred to as "crosslinking agent 1").

By using such a phenol derivative, the effect of the invention can be remarkably exhibited.

As the alkoxymethyl group to be bound to the benzene ring are preferable those having 6 carbon atoms or less. Specifically, are preferable a methoxymethyl group, an ethoxymethyl group, an n-propxymethyl group, an i-propoxymethyl group, an n-butoxymethyl group, an i-butoxymethyl group, a sec-butoxymethyl group, and a t-butoxymethyl group. Further, alkoxy-substituted alkoxy groups such as a 2-methoxyethoxy group and a 2-methoxy-1-propoxy group are also preferable.

A molecular weight of the crosslinking agent 1 is 1,300 or less, preferably 1,100 or less, and more preferably 900 or less.

Of these phenol derivatives, particularly preferred ones will be given below.

45
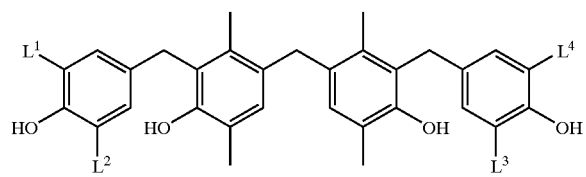
46
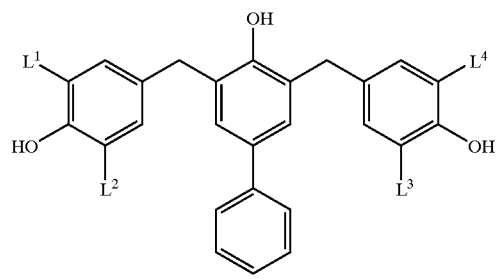
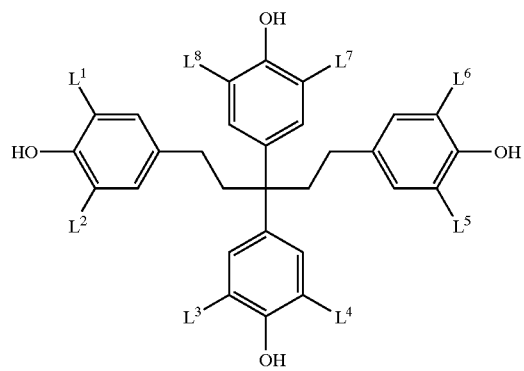
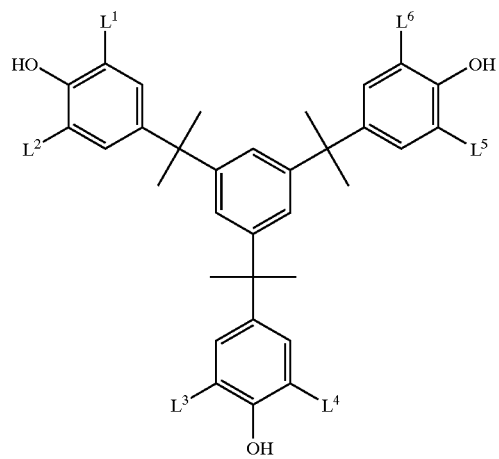
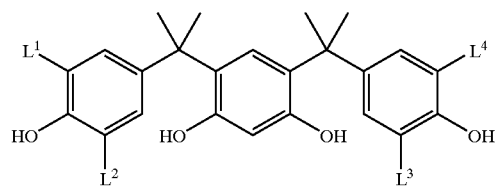
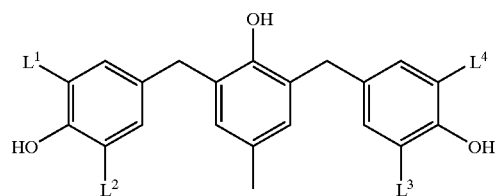
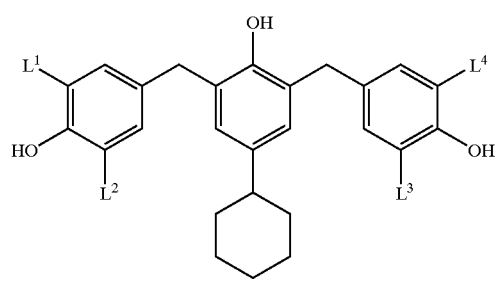
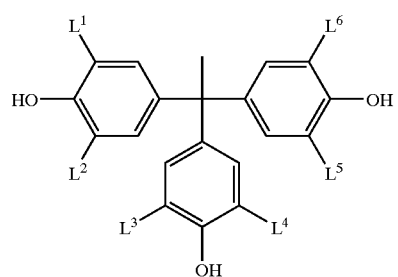
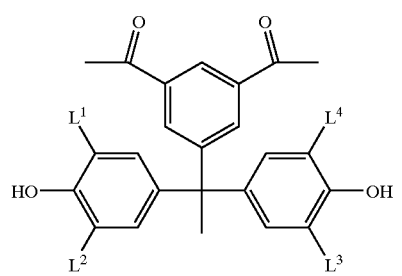
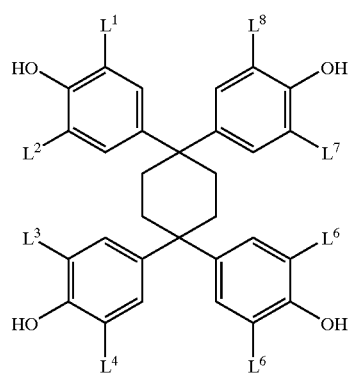

-continued
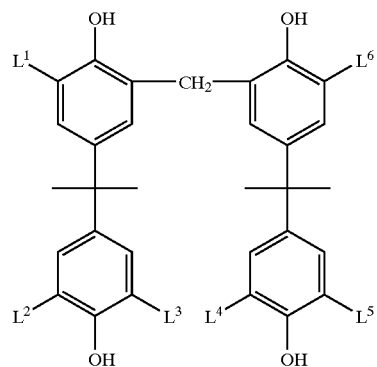
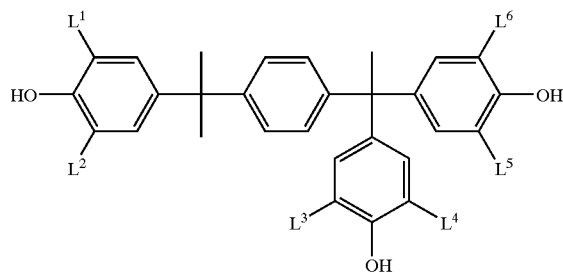
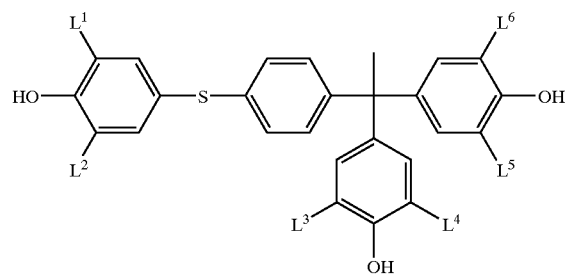
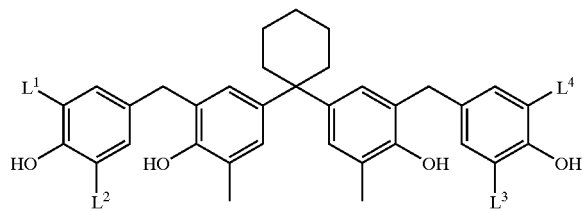
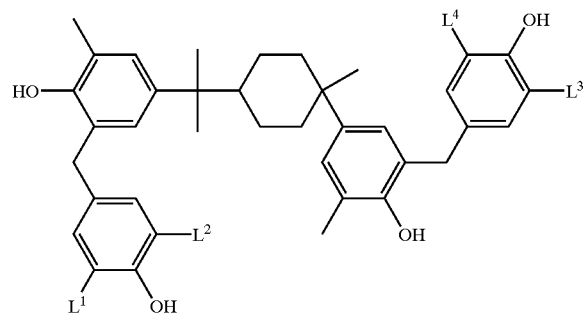
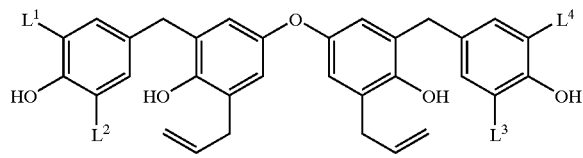
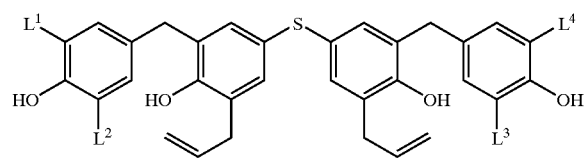
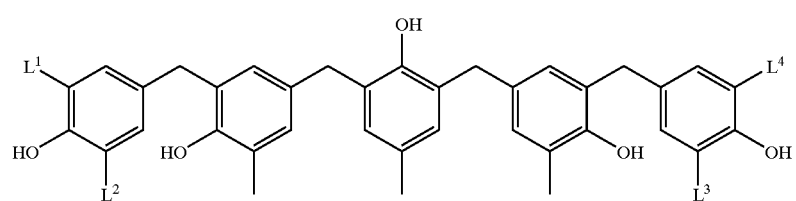

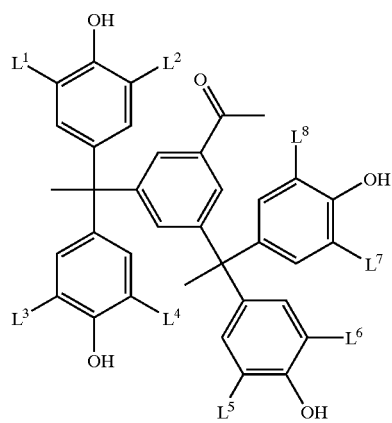

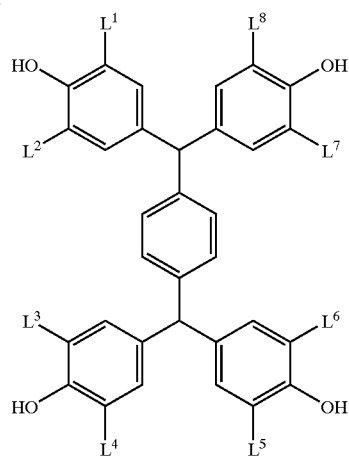

In the formulae, $L^1$ to $L^8$, which may be the same or different, each represents a hydroxymethyl group, a methoxymethyl group, or an ethoxymethyl group.

The phenol derivatives having a hydroxymethyl group can be obtained by reacting a corresponding hydroxymethyl group-free phenol compound (a compound represented by one of the foregoing formulae, wherein $L^1$ to $L^8$ each represents a hydrogen atom) and formaldehyde in the presence of a basic catalyst. During this time, in order to prevent resinification or gelation, it is preferred to carry out the reaction at a reaction temperature of 60° C. or lower. Concretely, the phenol derivatives can be synthesized by the method as described in, for example, JP-A-6-282067 and JP-A-7-64285.

The phenol derivatives having an alkoxymethyl group can be obtained by reacting a corresponding hydroxymethyl group-containing phenol derivative and an alcohol in the presence of an acid catalyst. During this time, in order to prevent resinification or gelation, it is preferred to carry out the reaction at a reaction temperature of 100° C. or lower. Concretely, the phenol derivatives can be synthesized by the method as described in, for example, European Patent EP632003A1.

The thus synthesized phenol derivatives having a hydroxymethyl group or an alkoxymethyl group are preferred from the standpoint of stability during the storage, but the phenol derivatives having an alkoxymethyl group are particularly preferred from the standpoint of stability during the storage.

These phenol derivatives having two or more (in total) hydroxymethyl groups or alkoxymethyl groups, in which the hydroxymethyl groups and the alkoxymethyl groups are bound concentrically to at least any one of the benzene rings or dividedly to the benzene rings, may be used singly or in admixture of two or more thereof.

[3]-2

As another kind of the crosslinking agent can be used phenol derivatives similarly.

Preferably, can be enumerated a phenol derivative containing one or two benzene rings and having two or more (in total) hydroxymethyl groups or alkoxymethyl groups in the molecule thereof, in which the hydroxymethyl groups and the alkoxymethyl groups are bound concentrically to at least any one of the benzene rings or dividedly to the benzene rings (this phenol derivative may be hereunder referred to as "crosslinking agent 2").

By using such a phenol derivative, the effect of the invention can be remarkably exhibited.

As the alkoxymethyl group to be bound to the benzene ring are preferable those having 6 carbon atoms or less. Specifically, are preferable a methoxymethyl group, an ethoxymethyl group, an n-propxymethyl group, an i-propoxymethyl group, an n-butoxymethyl group, an i-butoxymethyl group, a sec-butoxymethyl group, and a t-butoxymethyl group. Further, alkoxy-substituted alkoxy groups such as a 2-methoxyethoxy group and a 2-methoxy-1-propoxy group are also preferable.

A molecular weight of the crosslinking agent 2 is 1,100 or less, preferably 900 or less, and more preferably 700 or less.

Of these phenol derivatives, particularly preferred ones will be given below.

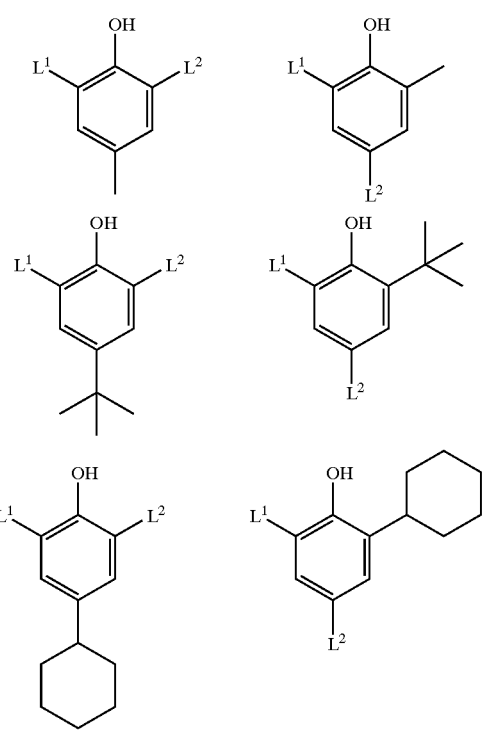

-continued

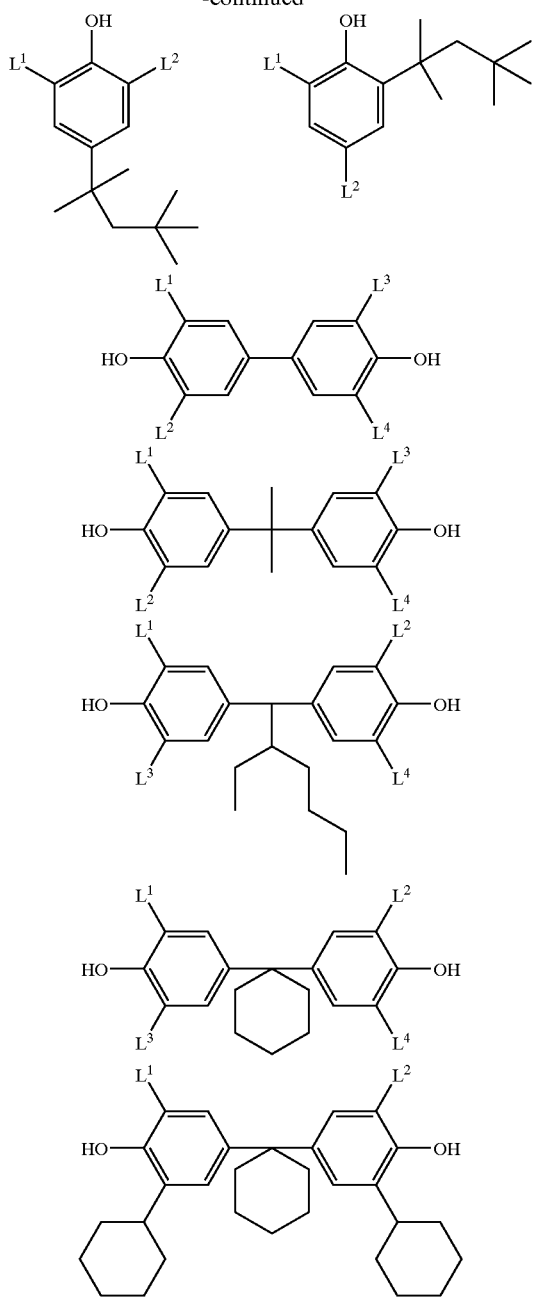

In the formulae, $L^1$ to $L^4$, which may be the same or different, each represents a hydroxymethyl group, a methoxymethyl group, or an ethoxymethyl group.

The phenol derivatives having an alkoxymethyl group can be obtained by reacting a corresponding hydroxymethyl group-containing phenol derivative and an alcohol in the presence of an acid catalyst. During this time, in order to prevent resinification or gelation, it is preferred to carry out the reaction at a reaction temperature of 100° C. or lower. Concretely, the phenol derivatives can be synthesized by the method as described in, for example, European Patent EP632003A1.

The thus synthesized phenol derivatives having a hydroxymethyl group or an alkoxymethyl group are preferred from the standpoint of stability during the storage, but the phenol derivatives having an alkoxymethyl group are particularly preferred from the standpoint of stability during the storage.

These phenol derivatives having two or more (in total) hydroxymethyl groups or alkoxymethyl groups, in which the hydroxymethyl groups and the alkoxymethyl groups are bound concentrically to at least any one of the benzene rings or dividedly to the benzene rings, may be used singly or in admixture of two or more thereof.

A ratio of the crosslinking agent 1 to the crosslinking agent 2 as the crosslinking agent (C) of the invention is from 100/0 to 20/80, preferably from 98/2 to 30/70, and more preferably from 98/2 to 35/65 in terms of molar ratio.

[3]-3 Other Crosslinking Agents that can be Used in Combination:

In addition to the above-described phenol derivatives, the following compounds (i) and (ii) can be used as the crosslinking agent.

(i) Compounds having an N-hydroxymethyl group, an N-alkoxymethyl group, or an N-acyloxymethyl group
(ii) Epoxy compounds These crosslinking agents will be hereunder described in detail.

(i) As the compound having an N-hydroxymethyl group, an N-alkoxymethyl group, or an N-acyloxymethyl group are enumerated the monomers, oligomer-melamine-formaldehyde condensates, and urea-formaldehyde condensates as disclosed in EP-A-0133216 and West German Patents 3,634,671 and 3,711,264; and the benzoguanamine-formaldehyde condensates such as alkoxy-substituted compounds, as disclosed in EP-A-0212482.

Further, preferred examples include melamine-formaldehyde derivatives having at least two free N-hydroxymethyl groups, N-alkoxymethyl groups, or N-acyloxymethyl groups, with N-alkoxymethyl derivatives being particularly preferred.

(ii) As the epoxy compound are enumerated epoxy compounds containing one or more epoxy groups, in a monomer, dimer, oligomer, or polymer state. Examples include reaction products between bisphenol A and epichlorohydrin and reaction products between a low-molecular weight phenol-formaldehyde resin and epichlorohydrin. Also, the epoxy compounds as described and used in U.S. Pat. No. 4,026,705 and British Patent 1,539,192 can be enumerated.

In the invention, the foregoing phenol derivatives are preferred. Besides the foregoing phenol derivatives, for example, the above-described other crosslinking agents (i) and (ii) can be used in combination.

A ratio of other crosslinking agents that can be used in combination in addition to the foregoing phenol derivatives (crosslinking agent 1 and crosslinking agent 2) is from 100/0 to 20/80, preferably from 90/10 to 40/60, and more preferably from 80/20 to 50/50 in terms of molar ratio.

An addition amount of the crosslinking agent (C) is from 3 to 70% by weight, and preferably from 5 to 50% by weight with respect to the total solids content of the composition. When the addition amount of the crosslinking agent is less than 3% by weight, the rate of residual film is lowered. On the other hand, when it exceeds 70% by weight, the resolving power is lowered, and such is not so desirable from the standpoint of stability during the storage of the resist liquid.

[4] Other Components that are Used in the Composition of the Invention:

If desired, the negative resist composition of the invention can further contain, for example, a nitrogen-containing basic compound, a dye, a solvent, a surfactant, a plasticizer, a photo-decomposable basic compound, and a photo-base generator.

[4]-1 Nitrogen-Containing Basic Compound (component (E)):

A preferred nitrogen-containing basic compound that can be used in the invention is a compound having a stronger basicity than phenol.

As a preferred chemical environment can be enumerated the following structures (A) to (E).

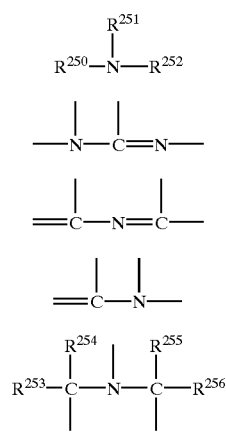

In the formulae, $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms, or a substituted or unsubstituted aryl group having from 6 to 20 carbon atoms, and $R^{251}$ and $R^{252}$ may be taken together to form a ring; and $R^{253}$ $R^{254}$, $R^{255}$, and $R^{256}$, which may be the same or different, each represents an alkyl group having from 1 to 6 carbon atoms.

The compound is preferably a nitrogen-containing basic compound having two or more nitrogen atoms of a chemical environment different from each other in one molecule thereof, and particularly preferably a compound containing ring structures containing a substituted or unsubstituted amino group and a nitrogen atom, respectively, or a compound having alkylamino groups.

Specific examples include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted imidazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines, and substituted or unsubstituted aminoalkylmorpholines. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

As the particularly preferred compound are enumerated guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)-morpholine. However, it should not be construed that the invention is limited thereto.

These nitrogen-containing basic compounds may be used singly or in admixture of two or more thereof.

A ratio of the photo-acid generator to the nitrogen-containing basic compound to be used in the composition is preferably from 2.5 to 300 in terms of molar ratio. When this molar ratio is less than 2.5, the sensitivity is low, and the resolving power may possibly be lowered. On the other hand, when it exceeds 300, the thickening of the resist patter with the laps of time until the heating processing after the exposure becomes large, and the resolving power may possibly be lowered. The molar ratio of the photo-acid generator to the nitrogen-containing basic compound is more preferably from 5.0 to 200, and particularly preferably from 7.0 to 150.

[4]-2 Dye:

As the suitable dye are enumerated oil dyes and basic dyes. Specific examples include Oil Yellow #101, Oil Yellow #103, Oil Pink #312, Oil Green BG, Oil Blue BOS, Oil Blue #603, Oil Black BY, Oil Black BS, and Oil Black T-505 (all of which are produced by Orient Chemical Industries, Ltd.), Crystal Violet (CI42555), Methyl Violet (CI42535), Rhodamine B (CI45170B), Malachite Green (CI42000), and Methylene Blue (CI52015).

[4]-3 Solvent:

The composition of the invention is dissolved in a solvent for dissolving the respect components and then applied on a support. Preferred examples of the solvent that is used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone, and tetrahydrofuran. These solvents may be used singly or in admixture of two or more thereof.

[4]-4 Surfactant:

A surfactant can be added to the solvent. Specifically, can be enumerated nonionic surfactants such as polyoxyethylene alkyl ethers (such as polyoxyethylene lauryl ether, polyoxyethylene stearyl ether, polyoxyethylene cetyl ether, and polyoxyethylene oleyl ether), polyoxyethylene alkylaryl ethers (such as polyoxyethylene octylphenol ether and polyoxyethylene nonylphenol ether), polyoxyethylene/polyoxypropylene block copolymers, sorbitan fatty acid esters (such as sorbitan monolaurate, sorbitan monopalmitate, sorbitan monostearate, sorbitan monooleate, sorbitan trioleate, and sorbitan tristearate), polyoxyethylene sorbitan fatty acid esters (such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate); fluorine-based surfactants or silicone-based surfactants such as Eftop EF301, Eftop EF303, and Eftop EF352 (all of which are produced by Shin Akita Kasei Co., Ltd.), Megafac F171 and Megafac F7173 (all of which are produced by Dainippon Ink and Chemicals, Incorporated), Fluorad FC430 and Fluorad FC431 (all of which are produced by Sumitomo 3M Limited), Asahi Guard AG710, Surflon S-382, Surflon SC101, Surflon SC102, Surflon SC103, Surflon SC104, Surflon SC105, and Surflon SC106 (all of which are produced by Asahi Glass Co., Ltd.), and Troy Sol S-366 (produced by Troy Chemical Industries, Inc.); organosiloxane polymer KP341 (produced by Shin-Etsu Chemical Co., Ltd.); and acrylic acid-based or methacrylic acid-based (co)polymers, Polyflow No. 75 and Polyflow No. 95 (all of which are produced by Kyoeisha Chemical Co., Ltd.).

An amount of the surfactant to be compounded is usually 2 parts by weight or less, and preferably 1 part by weight or less based on 100 parts by weight of the solids content of the composition of the invention.

These surfactants may be used in singly or in combination.

[4]-5 Plasticizer:

As the plasticizer that can be used in the negative resist composition according to the invention are enumerated the compounds described in JP-A-4-212960, JP-A-8-262720, European Patents 735,422, 416,873 and 439,371, and U.S. Pat. No. 5,846,690, such as di(2-ethylhexyl) adipate, n-hexyl benzoate, di-n-octyl phthalate, di-n-butyl phthalate, benzyl-n-butyl phthalate, and dihydroabietyl phthalate.

[4]-6 Photo-Decomposable Basic Compound:

Additionally, to the composition according to the invention can be added the ammonium salts described in JP-A-7-28247, European Patent 616,258, U.S. Pat. No. 5,525,443, JP-A-9-127700, European Patent 762,207, and U.S. Pat. No. 5,783,354, such as tetramethylammonium hydroxide, tetra-n-butylammonium hydroxide, and betaine; and can also be added the compounds (photo-bases) whose basicity is lowered by exposure, as described in JP-A-5-232706, JP-A-6-11835, JP-A-6-242606, JP-A-6-266100, JP-A-7-333851, JP-A-7-333844, U.S. Pat. No. 5,663,035, and European Patent 677,788.

[4]-7 Photo-Base Generator:

As the photo-base generator that can be added to the composition according to the invention are enumerated the compounds described in JP-A-4-151156, JP-A-4-162040, JP-A-5-197148, JP-A-5-5995, JP-A-6-194834, JP-A-8-146608, JP-A-10-83079, and European Patent 622,682, such as 2-nitrobenzyl carbamate, 2,5-dinitrobenzylcyclohexyl carbamate, N-cyclohexyl-4-methylphenyl sulfonamide, 1,1-dimethyl-2-phenylethyl-N-isopropyl carbamate. The photo-base generator is added for the purpose of improving the resist shape, etc.

The negative resist composition according to the invention is applied on a substrate to form a thin film. A film thickness of the coating film is preferably from 0.1 to 4.0 $\mu$m.

In the invention, if desired, a commercially available inorganic or organic anti-reflective film can be used. Also, an anti-reflective film can be applied and used as an upper layer of the resist.

As the anti-reflective film to be used a lower layer of the resist, any of inorganic film types such as titanium, titanium oxide, titanium nitride, chromium oxide, carbon, and amorphous silicon, and organic film types comprising a light absorber and a polymer material can be used. The former requires facilities such as vapor deposition units, CVD units, and sputtering units for the film formation. As the organic anti-reflective film are enumerated those comprising a condensate between a diphenylamine derivative and a formaldehyde-modified melamine resin, an alkali-soluble resin, and a light absorber, as described in JP-B-7-69611 (The term "JP-B" as used herein means an "examined Japanese patent application"); those comprising a reaction product between a maleic anhydride copolymer and a diamine type light absorber, as described in U.S. Pat. No. 5,294,680; those containing a resin binder and a methylolmelamine-based crosslinking agent, as described in JP-A-6-118631; acrylic resin type anti-reflective films containing a carboxyl group, an epoxy group, and a light absorbing group in the same molecule, as described in JP-A-6-118656; those comprising methylolmelamine and a benzophenone-based light absorber, as described in JP-A-8-87115; and those comprising a polyvinyl alcohol resin having a low-molecular weight light absorber added thereto, as described in JP-A-8-179509.

As the organic anti-reflective film can also be used commercially available organic anti-reflective films such as DUV-30 series and DUV-40 series (produced by Brewer Science Limited) and AR-2, AR-3 and Ar-5 (produced by Shipley).

In the production of large-scale integrated circuit devices, the pattern formation steps on the resist film comprises applying the negative resist composition according to the invention on a substrate (such as silicon/silicon dioxide coatings, glass substrates, and metal substrates) and undergoing irradiation using a KrF excimer laser, electron beam or X-ray image-drawing unit, followed by-heating, development, rinsing and drying. Thus, a good resist pattern can be formed.

As the light source of exposure are preferably enumerated units using lights having a wavelength of from 150 to 250 nm (such as KrF excimer laser (248 nm), ArF excimer laser (193 nm), and F2 excimer laser (157 nm), electron beams, and X-rays., and particularly KrF excimer laser).

As the development liquid of the negative resist composition according to the invention can be used aqueous solutions of alkalis such as inorganic alkalis (such as sodium hydroxide, potassium hydroxide, sodium carbonate, sodium silicate, sodium metasilicate, and ammonia water), primary amines (such as ethylamine and n-propylamine), secondary amines (such as diethylamine and di-n-butylamine), tertiary amines (such as triethylamine and methyldiethylamine), alcoholamines (such as dimethylethanolamine and triethanolamine), quaternary ammonium salts (such as tetramethylammonium hydroxide, tetraethylammonium hydroxide, and choline), and cyclic amines (such as pyrrole and piperidine). Further, proper amounts of alcohols such as isopropyl alcohol or surfactants such as nonionic surfactants can be added to the aqueous solution of alkali and then provided for the use.

Of these development liquids are preferable aqueous solutions of quaternary-ammonium salts, and more preferable those of tetramethylammonium hydroxide and choline.

EXAMPLES

The invention will be described below in more detail with reference to the Examples, but it should not be construed that the content of the invention is limited thereto.

1. Synthesis Example of Constitutional Materials:

(1) Alkali-Soluble Polymer:

3.9 g (0.024 moles) of 4-acetoxystyrene and 0.8 g (0.006 moles) of 4-methoxystyrene were dissolved in 30 mL of 1-methoxy-2-propanol. To the solution, 70 mL of a solution of 50 mg of 2,2'-azobis(2,4-dimethylvaleronitrile) (trade name: V-65, produced by Wako Pure Chemical Industries, Ltd.) as a polymerization initiator, 9.1 g (0.056 moles) of 4-acetoxystyrene and 1.9 g (0.014 moles) of 4-methoxystyrene in 1-methoxy-2-propanol was added dropwise with stirring at 70° C. over 2 hours in a nitrogen stream. Thereafter, 50 mg of the initiator was supplemented, and the reaction was continued for an additional 2 hours. Then, the temperature was elevated to 90° C., and stirring was continued for one hour. After allowing the reaction mixture to stand for cooling, it was poured into 1 L of water with vigorous stirring, to deposit a white resin. The obtained resin was dried and dissolved in 100 mL of methanol. To the solution was added 25% tetramethylammonium hydroxide, thereby hydrolyzing an acetoxy group in the resin. The reaction mixture was then neutralized with a hydrochloric acid aqueous solution to deposit a white resin. The obtained resin was washed with ion-exchanged water and dried in vacuo to obtain 11.6 g of the resin (29) of the invention. A molecular weight of the resin (29) was measured by GPC. As a result, the resin (29) had a weight average molecular weight (Mw: polystyrene reduced value) of 9,200 and a degree of dispersion (Mw/Mn) of 2.2.

The resin (B) of the invention was synthesized similarly.

(2) Photo-Acid Generator:

1) Synthesis of Pentafluorobenzenesulfonic Acid Tetramethyl ammonium Salt:

25 g of pentafluorobenzenesulfonyl chloride was dissolved in 100 mL of methanol under ice cooling, and 100 q of a 25% tetramethylammonium hydroxide aqueous solution was gradually added to the solution. The mixture was stirred at room temperature for 3 hours to obtain a solution of pentafluorobenzenesulfonic acid tetramethylammonium salt. This solution was used for salt exchange with sulfonium salt and iodonium salt.

2) Synthesis of Triphenylsulfonium Pentafluorobenzenesulfonate:

50 g of diphenyl sulfoxide was dissolved in 800 µL of benzene, and 200 g of aluminum chloride was added to the solution, followed by refluxing for 24 hours. The reaction mixture was gradually poured into 2 L of ice, 400 mL of concentrated hydrochloric acid was added thereto, and the mixture was heated at 70° C. for 10 minutes. The resulting aqueous solution was washed with 500 mL of ethyl acetate and filtered, and a solution of 200 g of ammonium iodide in 400 mL of water was added thereto. A deposited powder was collected by filtration, washed with water, and further washed with ethyl acetate, followed by drying to obtain 70 g of triphenylsulfonium iodide.

30.5 g of triphenylsulfonium iodide was dissolved in 1,000 mL of methanol, 19.1 g of silver oxide was added to the solution, and the mixture was stirred at room temperature for 4 hours. The solution was filtered, and an excess amount of the solution of pentafluorobenzenesulfonic acid tetramethyl-ammonium salt was added thereto. The reaction mixture was concentrated and then dissolved in 500 mL of dichloromethane. The solution was washed with a 5% tetramethylammonium hydroxide aqueous solution and water. An organic phase was dried over anhydrous sodium sulfate and concentrated to obtain triphenylsulfonium pentafluorobenzenesulfonate (PAG 4-7).

3) Synthesis of di(4-t-amylphenyl)iodonium pentafluorobenzenesulfonate:

60 g of t-amylbenzene, 39.5 g of potassium iodate, 81 g of acetic anhydride, and 170 mL of dichloromethane were mixed with each other, and 66.8 g of concentrated sulfuric acid was gradually added dropwise thereto under ice cooling. The mixture was stirred under ice cooling for 2 hours and then stirred at room temperature for 10 hours. To the reaction mixture was added 500 mL of water under cooling, and the mixture was extracted with dichloromethane. An organic phase was washed successively with sodium hydrogencarbonate and water, and then concentrated to obtain di(4-t-amylphenyl)iodonium sulfate. This sulfate was added to an excess amount of the solution of pentafluorobenzenesulfonic acid tetramethylammonium salt. 500 mL of water was added to this solution, and the mixture was extracted with dichloromethane. An organic phase was washed successively with a 5% tetramethylammonium hydroxide aqueous solution and water, and then concentrated to obtain di(4-t-amylphenyl)iodonium pentafluorobenzenesulfonate (PAG 3-22).

Other compounds were synthesized similarly.

(3) Crosslinking Agent:

1) Synthesis of [HM-1]:

To a 10% potassium hydroxide aqueous solution was added 20 g of 1-[α-methyl-α-(4-hydroxyphenyl)ethyl]-4-[(α,α-bis-(4-hydroxyphenyl) ethyl]benzene (Trisp-PA, produced by Honshu Chemical Industry Co., Ltd.), followed by stirring for dissolution. Next, 60 mL of a 37% formalin aqueous solution was added to the solution step-by-step with stirring at room temperature over one hour. The mixture was stirred at room temperature for an additional 6 hours. Thereafter, the reaction mixture was poured into a diluted sulfuric acid aqueous solution. Deposits were filtered, thoroughly washed with water, and then recrystallized from 30 mL of methanol. There was thus obtained 20 g of a white powder of a hydroxymethyl group-containing phenol derivative [HM-1] having the following structure. Its purity was found to be 92% (by the liquid chromatography).

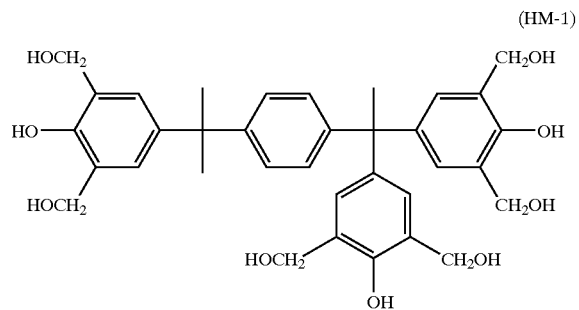

(HM-1)

2) Synthesis of [MM-1]:

20 g of the hydroxymethyl group-containing phenol derivative [HM-1] as obtained in the foregoing synthesis example was added to one liter of methanol, and the mixture was heated and stirred for dissolution. Next, 1 mL of concentrated sulfuric acid was added to the solution, and the mixture was heated under reflux for 12 hours. After completion of the reaction, the reaction mixture was cooled, and 2 g of potassium carbonate was added thereto. The mixture was thoroughly concentrated, and 300 mL of ethyl acetate was added thereto. The resulting solution was washed with water and concentrated to dryness. There was thus obtained 22 g of a white powder of a methoxymethyl group-containing phenol derivative [MM-1] having the following structure. Its purity was found to be 90% (by the liquid chromatography).
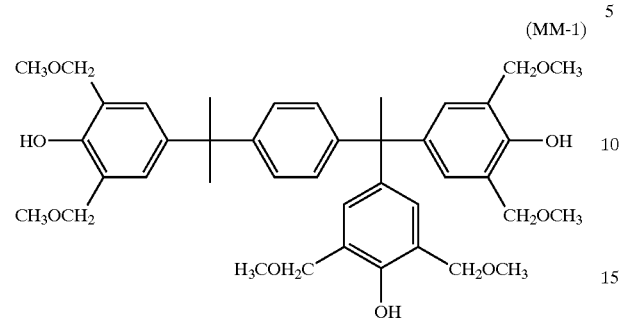
(MM-1)
The following phenol derivatives were synthesized similarly.
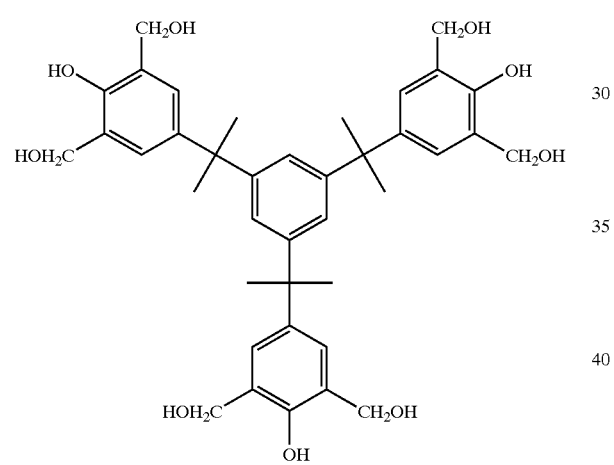
(HM-2)
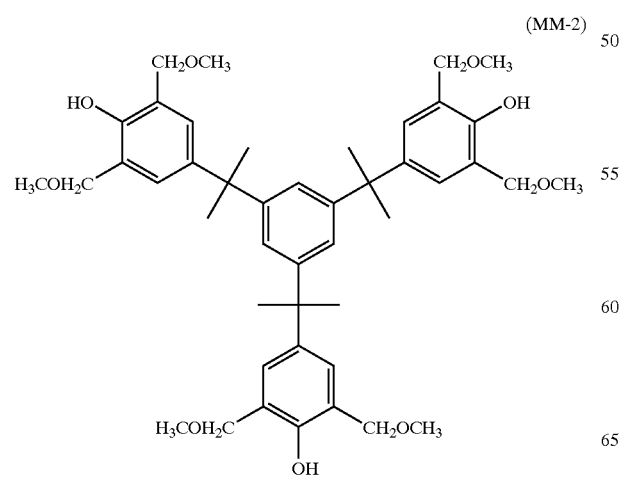
(MM-2)
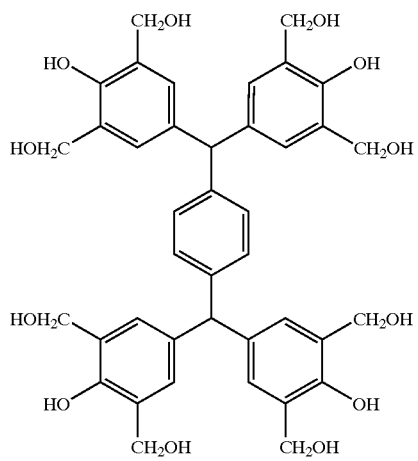
(HM-3)
(MM-3)
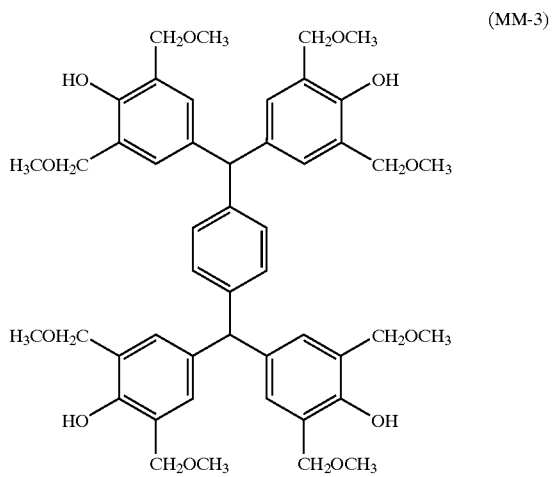
(HM-4)
(MM-4)
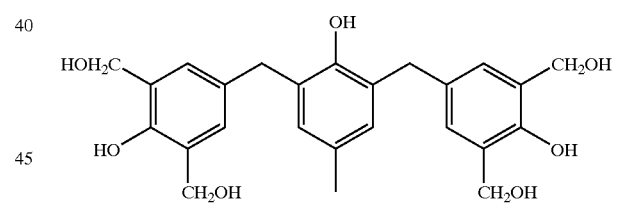
(MM-5)

-continued
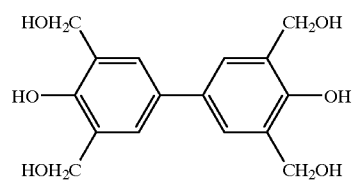
(HM-6)
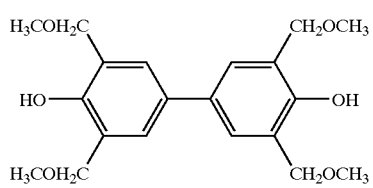
(MM-6)
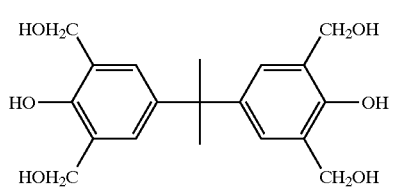
(HM-7)
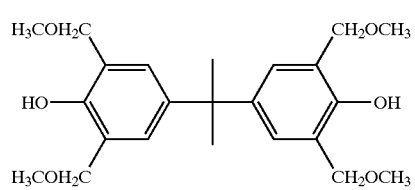
(MM-7)
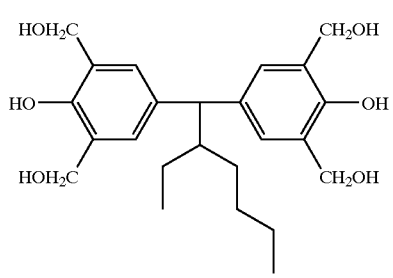
(HM-8)
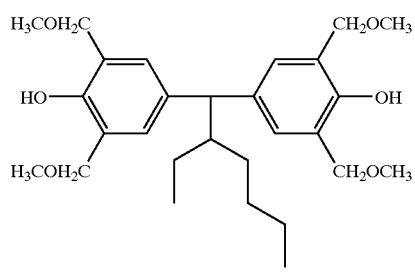
(MM-8)
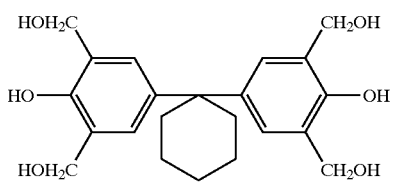
(HM-9)
-continued
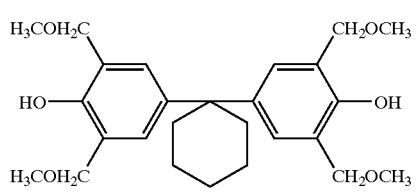
(MM-9)
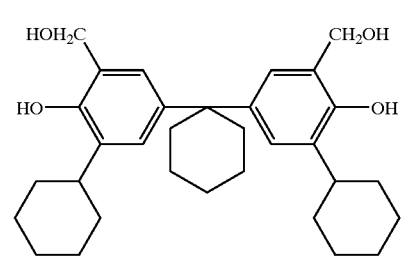
(HM-10)
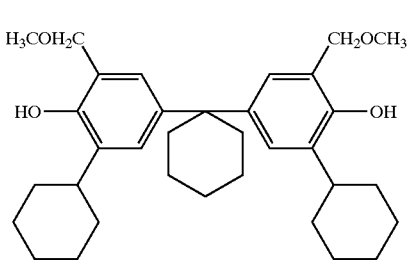
(MM-10)
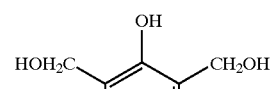
(HM-11)
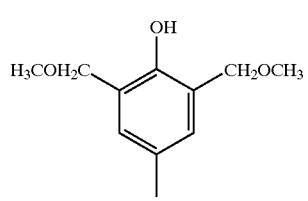
(MM-11)
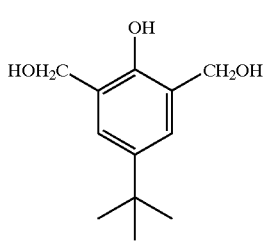
(HM-12)
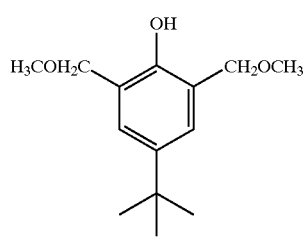
(MM-12)

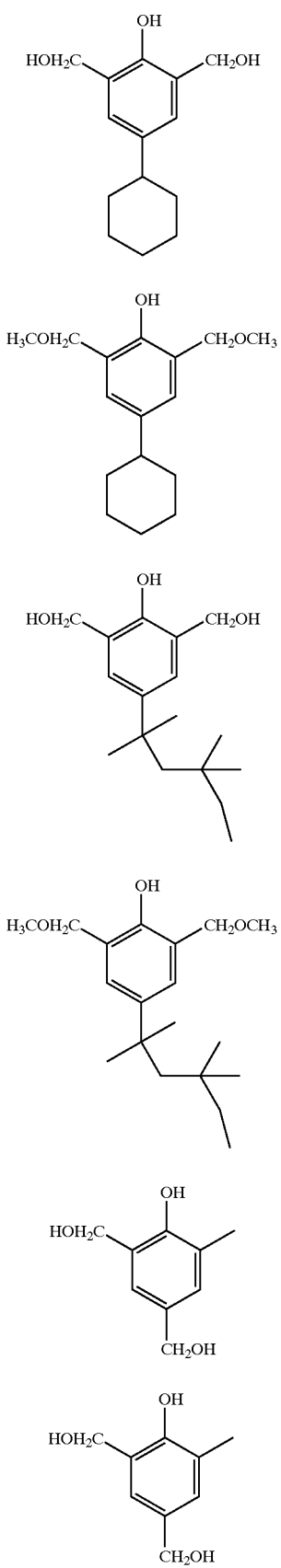
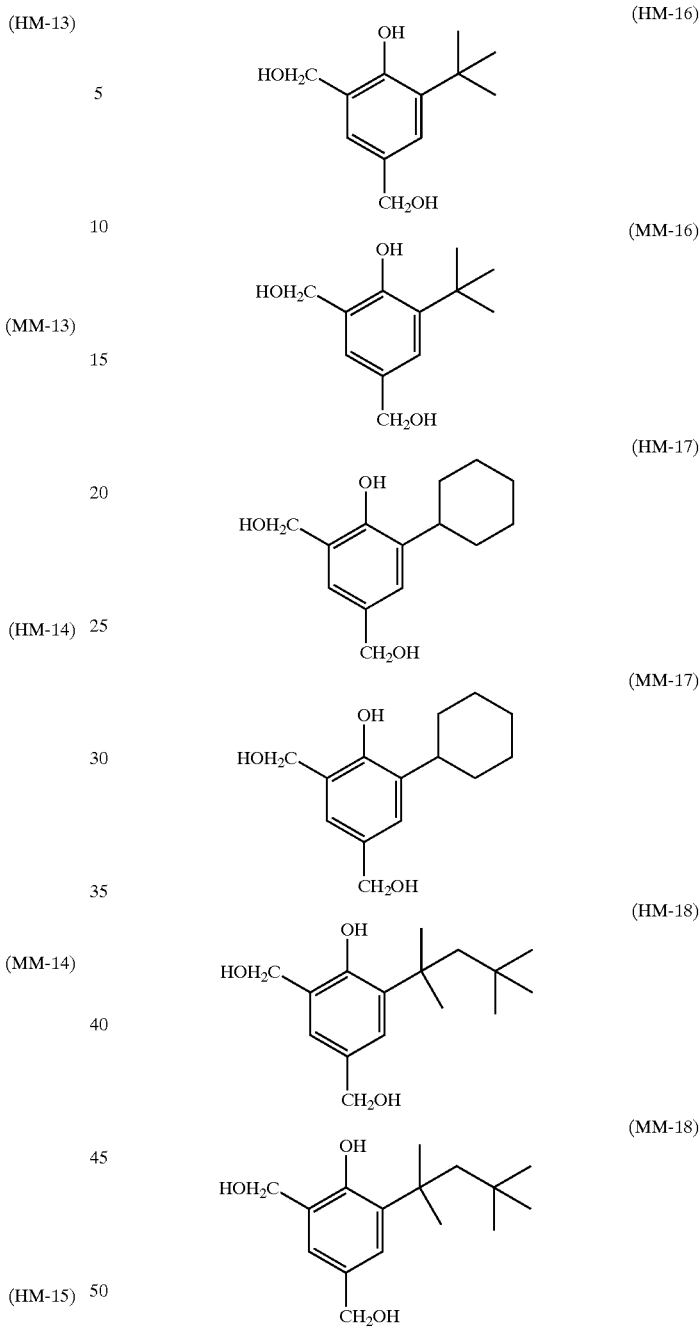

Example 1

(1) Application of Negative Resist:

| Component (A): | Photo-acid generator PAG 4–7 | 0.05 g |
| --- | --- | --- |
| Component (B): | Resin (1) | 0.80 g |
| Component (C): | Crosslinking agent MM-1 | 0.20 g |
|  | Crosslinking agent MM-6 | 0.05 g |

The above components were dissolved in 8.5 g of propylene glycol monomethyl ether acetate. Further, 0.002 g of OE-1 as the component (E) was added thereto and dissolved therein. Additionally, 0.001 g of Megafac R-08 (produced by Dainippon Ink and Chemicals, Incorporated, hereafter referred to as "W-1") as a surfactant was added thereto and dissolved therein. The obtained solution was subjected to microfiltration by a membrane filter having an opening of 0.1 μm to obtain a resist solution.

This resist solution was applied on a 6-inch wafer using a spin coater, Mark 8 (produced by Tokyo Electron Limited) and dried on a hot plate at 110° C. for 90 seconds, to obtain a resist film having a film thickness of 0.3 μm.

(2) Preparation of Negative Resist Pattern:

The obtained resist film was subjected to pattern exposure using a KrF excimer stepper (FPA3000EX-5, produced by Canon Inc., wavelength: 248 nm, NA=0.63). After the exposure, the resist film was heated on a hot plate at 110° C. for 90 seconds, dipped in a 2.38% tetramethylammonium hydroxide (TMAH) aqueous solution for 60 seconds, and then rinsed with water for 30 seconds. The obtained pattern was evaluated in the following methods.

(2-1) Sensitivity:

A cross-sectional shape of the obtained pattern was observed using a scanning type electron microscope (S-4300, produced by Hitachi, Ltd.). A minimum exposure amount when 0.16 μm (line:space=1:1) was resolved was defined as a sensitivity.

(2-2) Resolving Power:

A critical resolving power (the line and the space were separated and resolved) at the exposure amount at which the above-described sensitivity was exhibited was defined as a resolving power.

(2-3) Pattern Shape:

A cross-sectional shape of the 0.16 μm-line pattern at the exposure amount at which the above-described sensitivity was exhibited was observed using a scanning type electron microscope (S-4300, produced by Hitachi, Ltd.). The evaluation was made according to the three grades, "rectangular", "slightly taper", and "taper".

(2-4) Line Edge Roughness:

With respect to a range of 5 μm-edges in the longitudinal direction of the 0.16 μm-line pattern at the exposure amount at which the above-described sensitivity was exhibited, a distance from the standard line on which the edge should have been present was measured at 50 points using a scanning type electron microscope (S-8840, produced by Hitachi, Ltd.), to obtain a standard deviation, from which 3a was calculated. The smaller the value, the better the performance was.

The results of Example 1 were good as shown below. Sensitivity: 29 mJ/cm$^2$, resolving power: 0.13 μm, pattern shape: rectangular, line edge roughness: 6.0 nm.

Examples 2 to 9

Using the respective components as shown in Table 1, resist solutions were prepared, and negative patterns were formed and evaluated in the same manner as in Example 1. The evaluation results are shown in Table 2.

Comparative Example 1

A resist solution was prepared, and a negative pattern was formed and evaluated in the same manner as in Example 1, except that MM-6 as the component (C) was not used. The evaluation results are shown in Table 2.

Comparative Example 2

A resist solution was prepared, and a negative pattern was formed and evaluated in the same manner as in Example 1, except that MM-2 was used in place of MM-6 as the component (C). The evaluation results are shown in Table 2.

TABLE 1

| | (B) Resin 0.8 g | (A) Acid generator 0.05 g | (C) Crosslinking agent 1 | (C) Crosslinking agent 2 | (D) Nitrogen-containing basic compound 0.002 g | Surfactant 0.001 g |
|---|---|---|---|---|---|---|
| Example 1 | (1) Mw = 8000 Mw/Mn = 1.5 | PAG 4–7 | MM-1 0.20 g | MM-6 0.05 g | OE-1 | W-1 |
| Example 2 | (2) Mw = 12000 Mw/Mn = 1.4 | PAG 4–7 | MM-1 0.20 g | MM-7 0.05 g | OE-2 | W-1 |
| Example 3 | (28) Mw = 7500 x/y = 8/2, Mw/Mn = 1.7 | PAG 3–22 | MM-2 0.20 g | MM-12 0.05 g | OE-3 | W-2 |
| Example 4 | (30) Mw = 9000 x/y = 8/2, Mw/Mn = 1.6 | PAG 4–36 | MM-1 0.18 g | MM-13 0.07 g | OE-3 | W-1 |
| Example 5 | (93) Mw = 7500 x/y = 8/2, Mw/Mn = 1.7 | PAG 4–26 | MM-1 0.20 g | HM-14 0.05 g | OE-1 | W-1 |
| Example 6 | (94) Mw = 7500 x/y = 9/1, Mw/Mn = 1.5 | PAG 4–24 | MM-3 0.15 g | HM-8 0.07 g | OE-4 | W-1 |
| Example 7 | (95) Mw = 7500 x/y = 7/3, Mw/Mn = 2.2 | PAG 3–22 | MM-1 0.10 g | MM-6 0.10 g | OE-3 | W-2 |
| Example 8 | (13) Mw = 10000 Mw/Mn = 1.8 | PAG 5–13 | MM-1 0.20 g | MM-17 0.05 g | OE-4 | W-1 |
| Example 9 | (1) Mw = 5000 Mw/Mn = 1.4 | PAG 6–15 | MM-1 0.15 g | MM-15 0.10 g | OE-1 | W-1 |
| Comparative Example 1 | (1) Mw = 8000 Mw/Mn = 1.5 | PAG 4–7 | MM-1 0.25 g | | OE-1 | W-1 |
| Comparative Example 2 | (28) Mw = 7500 x/y = 8/2, Mw/Mn = 1.7 | PAG 4–7 | MM-1 0.20 g | MM-2 0.05 g | OE-1 | W-1 |

Explanation of abbreviations in the table:
OE-1: 4-Dimethylaminopyridine
OE-2: Benzimidazole
OE-3: 2,4,5-Triphenylimidazole
OE-4: 1,4-Diazabicyclo[5.4.0]undecene
W-2: Troy Sol S-366 (produced by Troy Chemical Industries, Inc.)

TABLE 2

| | Sensitivity (mJ/cm²) | Resolving power (μm) | Pattern shape (3-grade evaluation) | Line edge roughness (nm) |
|---|---|---|---|---|
| Example 1 | 29 | 0.13 | Rectangular | 6.0 |
| Example 2 | 27 | 0.13 | Rectangular | 7.5 |
| Example 3 | 28 | 0.14 | Rectangular | 8.0 |
| Example 4 | 27 | 0.13 | Slightly taper | 8.5 |
| Example 5 | 24 | 0.14 | Rectangular | 5.5 |
| Example 6 | 24 | 0.13 | Rectangular | 6.0 |
| Example 7 | 27 | 0.13 | Rectangular | 7.5 |
| Example 8 | 29 | 0.14 | Slightly taper | 7.0 |
| Example 9 | 27 | 0.14 | Rectangular | 8.0 |
| Comparative Example 1 | 30 | 0.16 | Taper | 22.0 |
| Comparative Example 2 | 32 | 0.16 | Slightly taper | 23.0 |

Example 10
(1) Application of Negative Resist:

| Component (A): | Photo-acid generator PAG 4–33 | 0.05 g |
|---|---|---|
| Component (B): | Resin (1) | 0.80 g |
| Component (C): | Crosslinking agent MM-1 | 0.20 g |
| | Crosslinking agent MM-12 | 0.05 g |

The above components were dissolved in 8.5 g of propylene glycol monomethyl ether acetate. Further, 0.002 g of OE-1 as the component (E) was added thereto and dissolved therein. Additionally, 0.001 g of W-1 as a surfactant was added thereto and dissolved therein. The obtained solution was subjected to microfiltration by a membrane filter having an opening of 0.1 μm to obtain a resist solution.

This resist solution was applied on a 6-inch wafer using a spin coater, Mark 8 (produced by Tokyo Electron Limited) and dried on a hot plate at 110° C. for 90 seconds, to obtain a resist film having a film thickness of 0.3 μm.

(2) Preparation of Negative Resist Pattern:

The obtained resist film was irradiated using an electron beam image-drawing unit (HL750, produced by Hitachi, Ltd., acceleration voltage: 50 Kev). After the irradiation, the resist film was heated on a hot plate at 110° C. for 90 seconds, dipped in a 2.38% tetramethylammonium hydroxide (TMAH) aqueous solution for 60 seconds, and then rinsed with water for 30 seconds. The obtained pattern was evaluated in the same methods as in Example 1.

The results of Example 10 were good as shown below.
Sensitivity: 7.0 μC/cm², resolving power: 0.10 μm, pattern shape: rectangular, line edge roughness: 5.5 nm.

Examples 11 to 18 and comparative Examples 3 to 4

Using the respective components as shown in Table 3, resist solutions were prepared, and negative patterns were formed and evaluated in the same manner as in Example 10. The evaluation results are shown in Table 4.

TABLE 3

| | (B) Resin 0.8 g | (A) Acid generator 0.05 g | (C) Crosslinking agent 1 | (C) Crosslinking agent 2 | (D) Nitrogen-containing basic compound 0.002 g | Surfactant 0.001 g |
|---|---|---|---|---|---|---|
| Example 10 | (1) Mw = 8000, Mw/Mn = 1.5 | PAG 4–33 | MM-1 0.20 g | MM-12 0.05 g | OE-3 | W-1 |
| Example 11 | (2) Mw = 12000, Mw/Mn = 1.4 | PAG 4–7 | MM-1 0.20 g | MM-7 0.05 g | OE-2 | W-1 |
| Example 12 | (28) Mw = 7500, x/y = 7/3, Mw/Mn = 1.7 | PAG 3–22 | MM-2 0.20 g | MM-12 0.05 g | OE-3 | W-2 |
| Example 13 | (29) Mw = 9000, x/y = 8/2, Mw/Mn = 1.6 | PAG 4–36 | MM-1 0.18 g | MM-13 0.07 g | OE-3 | W-1 |
| Example 14 | (93) Mw = 7500, x/y = 8/2, Mw/Mn = 1.7 | PAG 4–33 | MM-1 0.20 g | HM-14 0.05 g | OE-3 | W-1 |
| Example 15 | (98) Mw = 7500, x/y = 9/1, Mw/Mn = 1.5 | PAG 4–24 | MM-3 0.15 g | HM-8 0.07 g | OE-4 | W-1 |
| Example 16 | (95) Mw = 7500, x/y = 7/3, Mw/Mn = 2.2 | PAG 3–19 | MM-1 0.10 g | MM-6 0.10 g | OE-2 | W-2 |
| Example 17 | (13) Mw = 10000, Mw/Mn = 1.8 | PAG 5–13 | MM-4 0.20 g | MM-17 0.05 g | OE-4 | W-1 |
| Example 18 | (3) Mw = 5000, Mw/Mn = 1.6 | PAG 6–15 | MM-1 0.15 g | MM-15 0.10 g | OE-1 | W-1 |
| Comparative Example 3 | (1) Mw = 8000, Mw/Mn = 1.5 | PAG 4–7 | MM-1 0.25 g | | OE-1 | W-1 |
| Comparative Example 4 | (27) Mw = 7500, x/y = 8/2, Mw/Mn = 1.6 | PAG 4–7 | MM-1 0.20 g | MM-2 0.05 g | OE-1 | W-1 |

TABLE 4

| | Sensitivity (μC/cm²) | Resolving power (μm) | Pattern shape (3-grade evaluation) | Line edge roughness (nm) |
|---|---|---|---|---|
| Example 10 | 7.0 | 0.10 | Rectangular | 5.5 |
| Example 11 | 7.5 | 0.11 | Rectangular | 6.0 |
| Example 12 | 8.0 | 0.12 | Rectangular | 5.0 |
| Example 13 | 7.5 | 0.11 | Rectangular | 7.0 |
| Example 14 | 6.5 | 0.09 | Rectangular | 5.5 |
| Example 15 | 7.0 | 0.09 | Rectangular | 6.0 |
| Example 16 | 8.0 | 0.10 | Rectangular | 8.0 |
| Example 17 | 8.5 | 0.11 | Slightly taper | 8.0 |
| Example 18 | 7.0 | 0.10 | Rectangular | 7.5 |

TABLE 4-continued

| | Sensitivity ($\mu C/cm^2$) | Resolving power ($\mu m$) | Pattern shape (3-grade evaluation) | Line edge roughness (nm) |
|---|---|---|---|---|
| Comparative Example 3 | 9.0 | 0.14 | Slightly taper | 18.5 |
| Comparative Example 4 | 9.5 | 0.13 | Slightly taper | 16.5 |

From the results shown in Tables 2 and 4, it can be understood that the negative resist compositions according to the invention, which use two kinds of specific crosslinking agents having a different skeleton from each other, are superior in resolving power and pattern shape, and are particularly improved in sensitivity and line edge roughness, as compared with those of the Comparative Examples.

According to the invention, it is possible to provide a negative resist composition superior in sensitivity, resolving power, pattern shape, and line edge roughness in the lithography using particularly KrG excimer laser or electron beams as an exposure light source.

This application is based on Japanese Patent application JP 2001-322176, filed Oct. 19, 2002, the entire content of which is hereby incorporated by reference, the same as if set forth at length.

What is claimed is:

1. A negative resist composition comprising:
   (A) a compound being capable of generating an acid upon irradiation with an actinic ray or a radiation;
   (B) an alkali-soluble polymer; and
   (C) at least two crosslinking agents being capable of generating crosslinking with the polymer (B) by an action of an acid,
   wherein the crosslinking agent (C) comprises at least two compounds having a different skeleton from each other, which are selected from phenol derivatives having at least one of a hydroxymethyl group and an alkoxymethyl group on a benzene ring thereof, in which a sum of the hydroxymethyl group and the alkoxymethyl group is two or more,
   one of the at least two crosslinking agents comprises one or two benzene rings in the molecule thereof, and
   other one of the at least two crosslinking agents comprises from 3 to 5 benzene rings in the molecule thereof.

2. The negative resist composition according to claim 1, further comprising (E) a nitrogen-containing basic compound.

3. The negative resist composition according to claim 2, wherein the polymer (B) is a polymer comprising a repeating unit represented by the following formula (b):

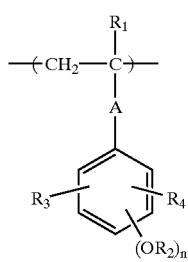

(b)

wherein $R_1$ represents a hydrogen atom, a halogen atom, a cyano group, or an optionally substituted alkyl group; $R_2$ represents a hydrogen atom or an optionally substituted alkyl group, cycloalkyl group, aryl group, aralkyl group or acyl group; $R_3$ and $R_4$, which may be the same or different, each represents a hydrogen atom, a halogen atom, a cyano group, or an optionally substituted alkyl group, cycloalkyl group, alkenyl group, aralkyl group or aryl group; A represents a single bond, an optionally substituted alkylene group, alkenylene group, cycloalkylene group, arylene group, —O—, —SO$_2$—, —O—CO—R$_5$—, —CO—O—R$_6$— or —CO—N(R$_7$)—R$_8$—; in which R$_5$, R$_6$, and R$_8$, which may be the same or different, each represents a single bond, an optionally substituted alkylene group, alkenylene group, cycloalkylene group or arylene group singly, or a divalent group formed from at least one of these groups taken together with at least one structure selected from the group consisting of an ether structure, an ester structure, an amide structure, a urethane structure, and a ureido structure; R$_7$ represents a hydrogen atom or an optionally substituted alkyl group, cycloalkyl group, aralkyl group or aryl group; n represents an integer of from 1 to 3; and plural R$_2$'s, R$_2$ and R$_3$, or R$_2$ and R$_4$, may be bound to each other to form a ring.

4. The negative resist composition according to claim 3, wherein a molecular weight of the polymer (B) is in a range of from 1,000 to 200,000 in terms of weight average molecular weight.

5. The negative resist composition according to claim 2, wherein the polymer (B) is a polymer comprising at least one repeating unit represented by the following formula (b-2) or (b-3):

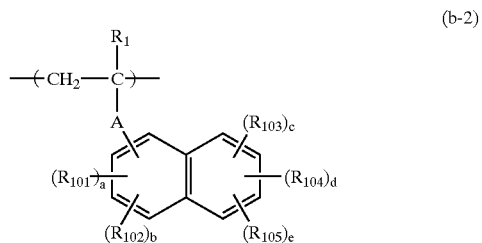

(b-2)

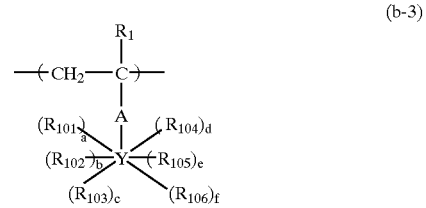

(b-3)

wherein $R_1$ represents a hydrogen atom, a halogen atom, a cyano group, or an optionally substituted alkyl group;
A represents a single bond, an optionally substituted alkylene group, alkenylene group, cycloalkylene group, arylene group, —O—, —SO$_2$—, —O—CO—R$_5$—, —CO—O—R$_6$— or —CO—N(R$_7$)—R$_8$—, in which R$_5$, R$_6$, and R$_8$, which may be the same or different, each represents a single bond, an optionally substituted alkylene group, alkenylene group, cycloalkylene group or arylene group singly, or a divalent group formed from at least one of these groups taken together with at least one structure selected from the group consisting of an ether structure, an ester structure, an amide structure, a urethane structure, and a ureido structure, R$_7$'s, which may be the same or different, each represents a hydrogen atom or an optionally substituted alkyl group, cycloalkyl group, aralkyl group or aryl group;

$R_{101}$ to $R_{106}$ each independently represents a hydroxyl group, a carboxy group, an amino group, or an optionally substituted alkyl group, cycloalkyl group, alkoxy group, alkylcarbonyloxy group, alkylsulfonyloxy group, alkenyl group, aryl group, aralkyl group, N-alkylamino group or N-dialkylamino group;

a, b, c, d, e and f each independently represents an integer of from 0 to 3; and Y represents one of the following condensed polycyclic aromatic structures:

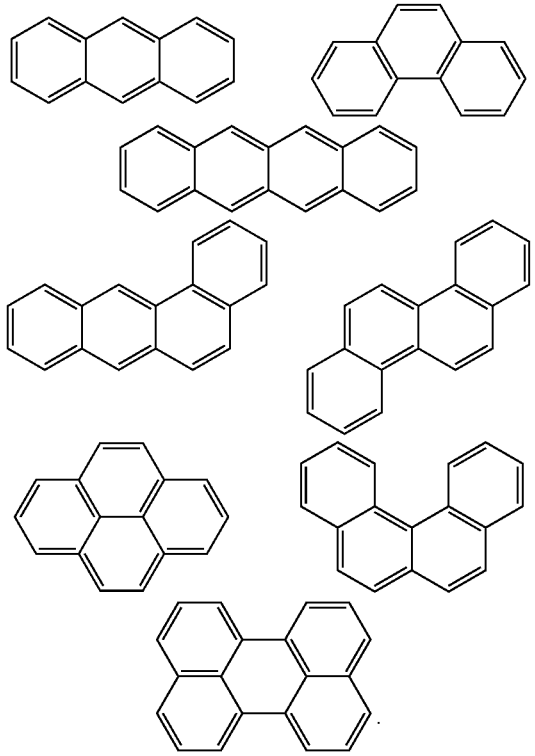

6. The negative resist composition according to claim 2, wherein the actinic ray or the radiation are one of an excimer laser light having a wavelength of from 150 to 250 nm, an electron beam, and a X-ray.

7. The negative resist composition according to claim 2, wherein the one of the at least two crosslinking agents has a molecular weight of 1,000 or less, and the other one of the at least two crosslinking agents has a molecular weight of 1,300 or less.

8. The negative resist composition according to claim 2, wherein a ratio of the other one of the at least two crosslinking agents to the one of the at least two crosslinking agents is from 100:0 to 20:80 in terms of molar ratio.

9. The negative resist composition according to claim 2, wherein an amount of the crosslinking agents (C) is from 3 to 70% by weight with respect to a total solids content of the composition.

10. The negative resist composition according to claim 1, wherein the polymer (B) is a polymer comprising a repeating unit represented by the following formula (b):

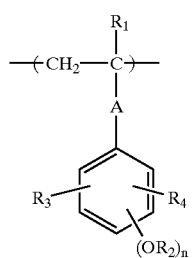

(b)

wherein $R_1$ represents a hydrogen atom, a halogen atom, a cyano group, or an optionally substituted alkyl group; $R_2$ represents a hydrogen atom or an optionally substituted alkyl group, cycloalkyl group, aryl group, aralkyl group or acyl group; $R_3$ and $R_4$, which may be the same or different, each represents a hydrogen atom, a halogen atom, a cyano group, or an optionally substituted alkyl group, cycloalkyl group, alkenyl group, aralkyl group or aryl group; A represents a single bond, an optionally substituted alkylene group, alkenylene group, cycloalkylene group, arylene group, —O—, —SO$_2$—, —O—CO—R$_5$—, —CO—O—R$_6$— or —CO—N(R$_7$)—R$_8$—; in which $R_5$, $R_6$, and $R_8$, which may be the same or different, each represents a single bond, an optionally substituted alkylene group, alkenylene group, cycloalkylene group or arylene group singly, or a divalent group formed from at least one of these groups taken together with at least one structure selected from the group consisting of an ether structure, an ester structure, an amide structure, a urethane structure, and a ureido structure; $R_7$ represents a hydrogen atom or an optionally substituted alkyl group, cycloalkyl group, aralkyl group or aryl group; n represents an integer of from 1 to 3; and plural $R_2$'s, $R_2$ and $R_3$, or $R_2$ and $R_4$, may be bound to each other to form a ring.

11. The negative resist composition according to claim 10, wherein a molecular weight of the polymer (B) is in a range of from 1,000 to 200,000 in terms of weight average molecular weight.

12. The negative resist composition according to claim 1, wherein the polymer (B) is a polymer comprising at least one repeating unit represented by the following formula (b-2) or (b-3):

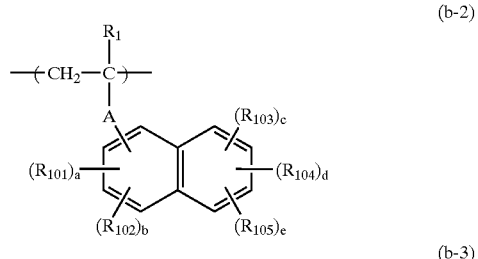

(b-2)

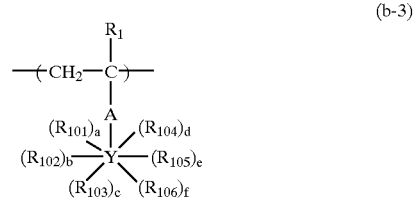

(b-3)

wherein $R_1$ represents a hydrogen atom, a halogen atom, a cyano group, or an optionally substituted alkyl group;

A represents a single bond, an optionally substituted alkylene group, alkenylene group, cycloalkylene group, arylene group, —O—, —SO$_2$—, —O—CO—R$_5$—, —CO—O—R$_6$— or —CO—N(R$_7$)—R$_8$—, in which $R_5$, $R_6$, and $R_8$, which may be the same or different, each represents a single bond, an optionally substituted alkylene group, alkenylene group, cycloalkylene group or arylene group singly, or a divalent group formed from at least one of these groups taken together with at least one structure selected from the group consisting of an ether structure, an ester structure, an amide structure, a urethane structure, and a ureido structure, $R_7$'s, which may be the same or different, each represents a hydrogen atom or an optionally substituted alkyl group, cycloalkyl group, aralkyl group or aryl group;

$R_{101}$ to $R_{106}$ each independently represents a hydroxyl group, a carboxy group, an amino group, or an optionally substituted alkyl group, cycloalkyl group, alkoxy group, alkylcarbonyloxy group, alkylsulfonyloxy group, alkenyl group, aryl group, aralkyl group, N-alkylamino group or N-dialkylamino group;

a, b, c, d, e and f each independently represents an integer of from 0 to 3; and Y represents one of the following condensed polycyclic aromatic structures:

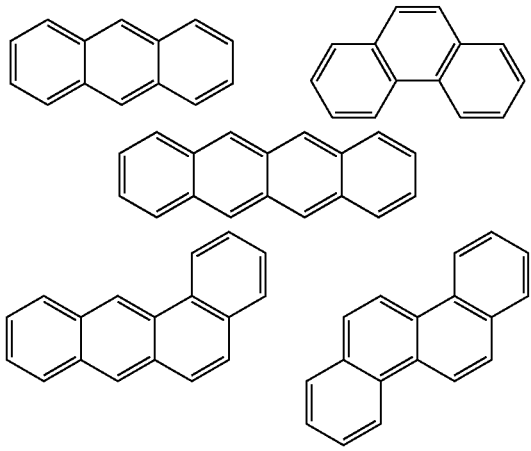

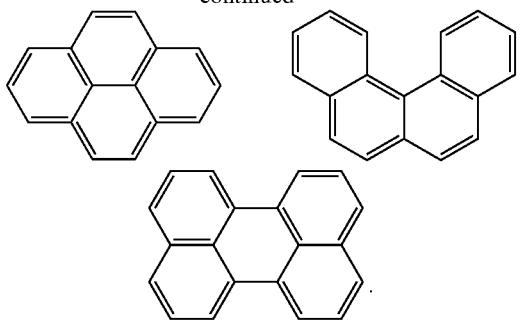

13. The negative resist composition according to claim 1, wherein the actinic ray or the radiation are one of an excimer laser light having a wavelength of from 150 to 250 nm, an electron beam, and a X-ray.

14. The negative resist composition according to claim 1, wherein the one of the at least two crosslinking agents has a molecular weight of 1,000 or less, and the other one of the at least two crosslinking agents has a molecular weight of 1,300 or less.

15. The negative resist composition according to claim 1, wherein a ratio of the other one of the at least two crosslinking agents to the one of the at least two crosslinking agents is from 100:0 to 20:80 in terms of molar ratio.

16. The negative resist composition according to claim 1, wherein an amount of the crosslinking agents (C) is from 3 to 70% by weight with respect to a total solids content of the composition.

* * * * *